United States Patent
Yamazaki et al.

(10) Patent No.: US 9,899,535 B2
(45) Date of Patent: *Feb. 20, 2018

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Tetsuhiro Tanaka, Kanagawa (JP); Hideomi Suzawa, Kanagawa (JP); Yasumasa Yamane, Kanagawa (JP); Yuhei Sato, Kanagawa (JP); Sachiaki Tezuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/292,287

(22) Filed: Oct. 13, 2016

(65) Prior Publication Data

US 2017/0033230 A1 Feb. 2, 2017

Related U.S. Application Data

(63) Continuation of application No. 14/580,651, filed on Dec. 23, 2014, now Pat. No. 9,472,678.

(30) Foreign Application Priority Data

Dec. 27, 2013 (JP) ................................ 2013-270926

(51) Int. Cl.
*H01L 29/786* (2006.01)
*H01L 29/16* (2006.01)
(Continued)

(52) U.S. Cl.
CPC ...... *H01L 29/7869* (2013.01); *H01L 27/0688* (2013.01); *H01L 27/088* (2013.01);
(Continued)

(58) Field of Classification Search
CPC ...................................................... H01L 29/16
(Continued)

(56) References Cited

U.S. PATENT DOCUMENTS

| | | |
|---|---|---|
| 5,528,032 A | 6/1996 | Uchiyama |
| 5,731,856 A | 3/1998 | Kim et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Earl Taylor
(74) *Attorney, Agent, or Firm* — Fish & Richardson P.C.

(57) ABSTRACT

To provide a transistor with stable electrical characteristics, a transistor with a low off-state current, a transistor with a high on-state current, a semiconductor device including the transistor, or a durable semiconductor device. The semiconductor device includes a first transistor using silicon, an aluminum oxide film over the first transistor, and a second transistor using an oxide semiconductor over the aluminum oxide film. The oxide semiconductor has a lower hydrogen concentration than silicon.

14 Claims, 40 Drawing Sheets

(51) Int. Cl.
*H01L 27/088* (2006.01)
*H01L 27/06* (2006.01)
*H01L 27/12* (2006.01)

(52) U.S. Cl.
CPC ...... *H01L 27/0886* (2013.01); *H01L 27/1225* (2013.01); *H01L 29/16* (2013.01)

(58) Field of Classification Search
USPC .......................................................... 257/43
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,838,397 | B2 | 1/2005 | Takayama et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 8,067,775 | B2 | 11/2011 | Miyairi et al. |
| 8,188,477 | B2 | 5/2012 | Miyairi et al. |
| 8,384,080 | B2 | 2/2013 | Taniguchi et al. |
| 8,461,007 | B2 | 6/2013 | Yamazaki |
| 8,502,216 | B2 | 8/2013 | Akimoto et al. |
| 8,530,289 | B2 | 9/2013 | Yamazaki |
| 8,541,266 | B2 | 9/2013 | Yamazaki |
| 8,547,771 | B2 | 10/2013 | Koyama |
| 8,637,347 | B2 | 1/2014 | Oikawa et al. |
| 8,692,252 | B2 | 4/2014 | Takata et al. |
| 8,828,811 | B2 | 9/2014 | Yamazaki |
| 8,921,125 | B2 * | 12/2014 | Nagai ............... H01L 21/76826 438/3 |
| 8,952,379 | B2 * | 2/2015 | Yamazaki ......... H01L 29/41733 257/43 |
| 9,006,736 | B2 | 4/2015 | Sasagawa et al. |
| 9,276,121 | B2 | 3/2016 | Yamazaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0181565 | A1 | 7/2010 | Sakata et al. |
| 2011/0095288 | A1 * | 4/2011 | Morosawa .......... H01L 29/7869 257/43 |
| 2011/0127523 | A1 | 6/2011 | Yamazaki |
| 2011/0260171 | A1 | 10/2011 | Yamazaki |
| 2011/0263082 | A1 | 10/2011 | Yamazaki |
| 2011/0263083 | A1 | 10/2011 | Yamazaki |
| 2011/0263084 | A1 | 10/2011 | Yamazaki |
| 2011/0263085 | A1 | 10/2011 | Yamazaki |
| 2011/0263091 | A1 | 10/2011 | Yamazaki |
| 2011/0309411 | A1 | 12/2011 | Takemura |
| 2011/0312127 | A1 | 12/2011 | Ishizuka et al. |
| 2012/0001170 | A1 | 1/2012 | Yamazaki |
| 2012/0040495 | A1 | 2/2012 | Noda et al. |
| 2012/0104385 | A1 | 5/2012 | Godo et al. |
| 2012/0132903 | A1 | 5/2012 | Yamazaki et al. |
| 2012/0161126 | A1 | 6/2012 | Yamazaki |
| 2012/0294102 | A1 | 11/2012 | Ishizu |
| 2013/0009148 | A1 | 1/2013 | Yamazaki |
| 2013/0069055 | A1 * | 3/2013 | Yamazaki ......... H01L 29/41733 257/43 |
| 2013/0075731 | A1 | 3/2013 | Han et al. |
| 2013/0187151 | A1 | 7/2013 | Yamazaki |
| 2013/0187153 | A1 | 7/2013 | Yamazaki et al. |
| 2013/0203214 | A1 * | 8/2013 | Isobe .................. H01L 21/0237 438/104 |
| 2013/0262765 | A1 * | 10/2013 | Tsutsui ............... G06F 12/0802 711/118 |

(56) References Cited

U.S. PATENT DOCUMENTS

| | | |
|---|---|---|
| 2013/0267068 A1 | 10/2013 | Hanaoka et al. |
| 2013/0270563 A1* | 10/2013 | Yamazaki ......... H01L 29/78609 257/57 |
| 2013/0300468 A1* | 11/2013 | Yamamoto ........... H03K 17/002 327/156 |
| 2014/0306217 A1 | 10/2014 | Yamazaki et al. |
| 2014/0339538 A1* | 11/2014 | Yamazaki ......... H01L 29/66969 257/43 |
| 2014/0339539 A1 | 11/2014 | Yamazaki et al. |
| 2014/0339544 A1* | 11/2014 | Hanaoka ............. H01L 29/7869 257/43 |
| 2014/0339546 A1 | 11/2014 | Yamazaki et al. |
| 2014/0339548 A1* | 11/2014 | Yamazaki ........... H01L 29/7869 257/43 |
| 2014/0339549 A1* | 11/2014 | Yamazaki ........... H01L 29/7869 257/43 |
| 2014/0339560 A1 | 11/2014 | Yamazaki et al. |
| 2014/0340608 A1 | 11/2014 | Yamazaki et al. |
| 2014/0361289 A1 | 12/2014 | Suzawa |
| 2014/0361290 A1 | 12/2014 | Yamazaki et al. |
| 2014/0361292 A1 | 12/2014 | Yamazaki et al. |
| 2014/0361293 A1* | 12/2014 | Yamazaki ......... H01L 29/78696 257/43 |
| 2014/0362324 A1 | 12/2014 | Yamazaki et al. |
| 2014/0374744 A1 | 12/2014 | Matsukura |
| 2015/0021596 A1 | 1/2015 | Yamazaki et al. |
| 2015/0028330 A1 | 1/2015 | Yamazaki et al. |
| 2015/0034949 A1 | 2/2015 | Yamazaki |
| 2015/0069384 A1 | 3/2015 | Kobayashi et al. |
| 2015/0076491 A1* | 3/2015 | Yamazaki ............... H01L 29/26 257/43 |
| 2015/0077162 A1 | 3/2015 | Yamazaki et al. |
| 2015/0084042 A1* | 3/2015 | Maeda .............. H01L 29/78696 257/43 |
| 2015/0084044 A1 | 3/2015 | Tanaka et al. |
| 2015/0084045 A1* | 3/2015 | Yamazaki ........... H01L 27/1222 257/43 |
| 2015/0102342 A1 | 4/2015 | Yamazaki |
| 2015/0153599 A1 | 6/2015 | Yamazaki et al. |
| 2015/0155362 A1 | 6/2015 | Nakazawa et al. |
| 2015/0155505 A1 | 6/2015 | Yamazaki et al. |
| 2015/0171115 A1 | 6/2015 | Yamazaki et al. |
| 2015/0171116 A1 | 6/2015 | Okazaki et al. |
| 2015/0171222 A1 | 6/2015 | Sasagawa et al. |
| 2015/0179803 A1 | 6/2015 | Yamazaki et al. |
| 2015/0187951 A1* | 7/2015 | Endo .................. H01L 29/7869 257/43 |
| 2015/0187952 A1* | 7/2015 | Yamazaki ........... H01L 29/7869 257/43 |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 06-275697 | A | 9/1994 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086010 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-243974 | A | 12/2011 |
| JP | 2012-059860 | A | 3/2012 |
| JP | 2012-257187 | A | 12/2012 |
| JP | 2013179286 | A * | 9/2013 |
| WO | WO-2004/114391 | | 12/2004 |

OTHER PUBLICATIONS

Asaoka.Y et al., "29.1:Polarizer-Free Reflective LCD Combined With Ultra Low-Power Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., 21.2:Al and Sn-Doped Zinc Indium Oxide Thin Film Transistors for AMOLED Back-Plane, SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

(56) References Cited

OTHER PUBLICATIONS

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White TANDEM OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., Development of Driver-Integrated Panel Using Amorphous In—Ga—Zn-Oxide TFT, AM-FPD '09 Digest of Technical Papers, Jul. 1, 2009, pp. 33-36.
Park.J et al., "Amorphous Indium-Gallium-Zinc Oxide TFTS and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

(56) References Cited

OTHER PUBLICATIONS

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

FIG. 18A
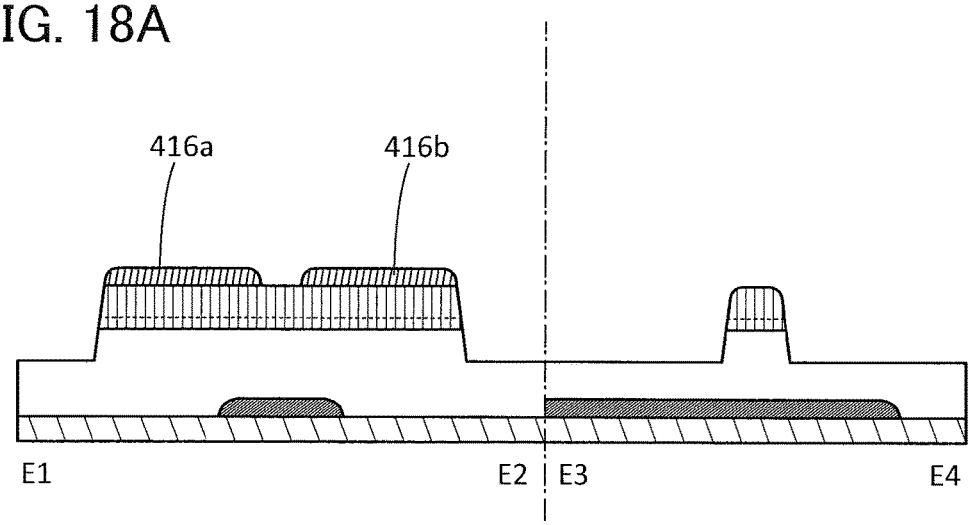
FIG. 18B
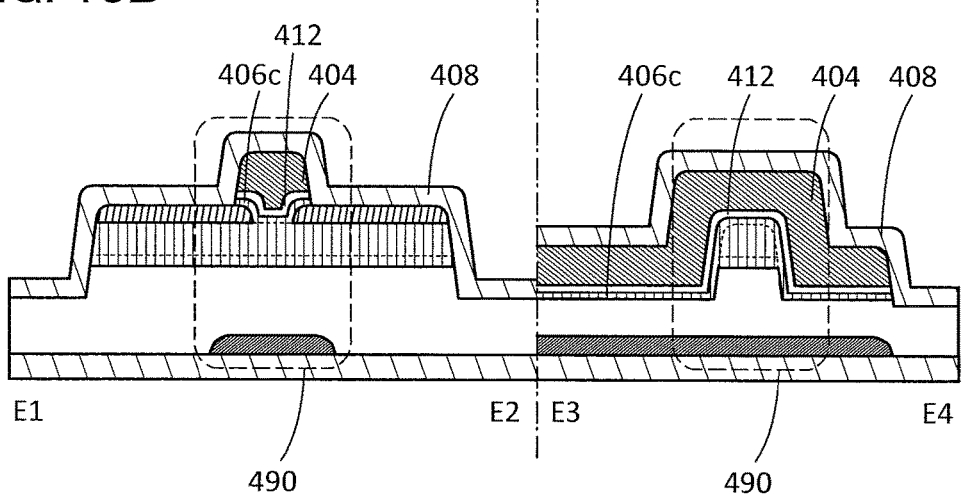
FIG. 18C1
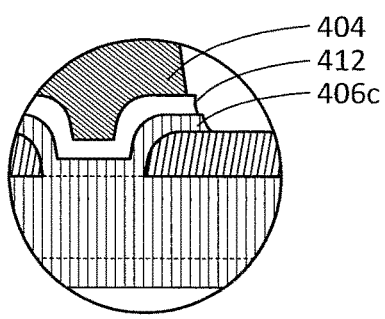
FIG. 18C2
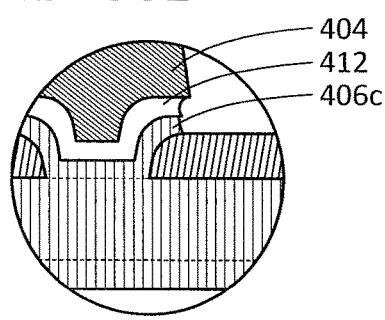

FIG. 31A1 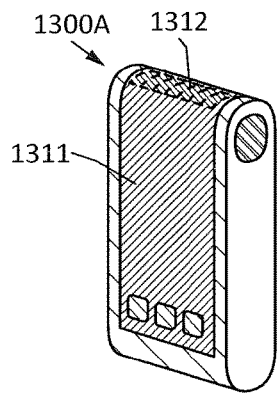
FIG. 31A2 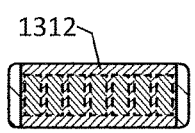
FIG. 31A3 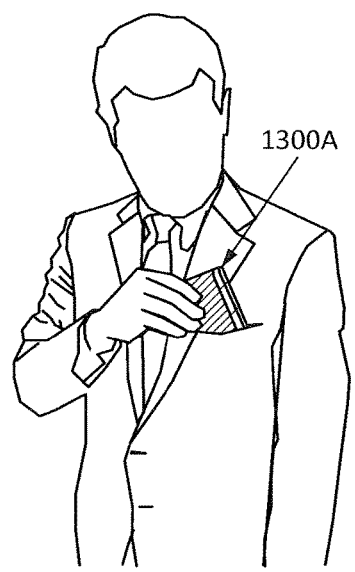
FIG. 31B1 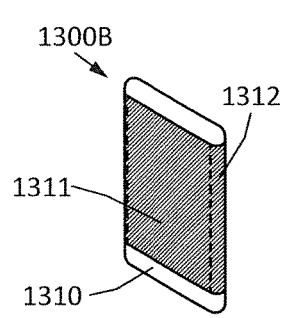
FIG. 31B2 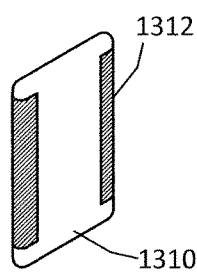
FIG. 31C1 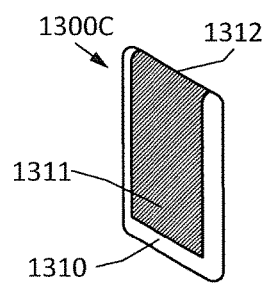
FIG. 31C2 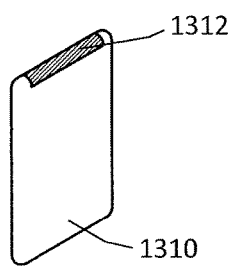

FIG. 33A
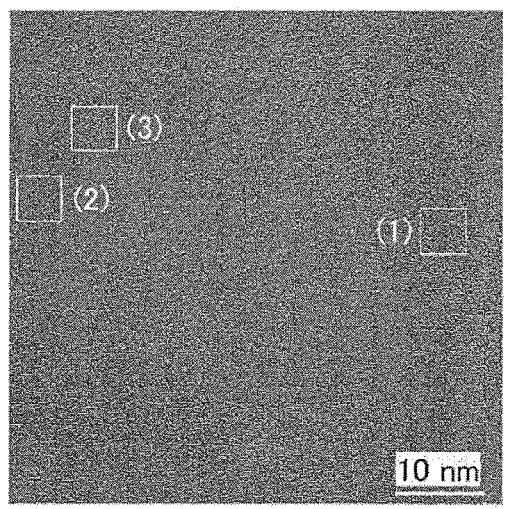
FIG. 33B    FIG. 33C    FIG. 33D
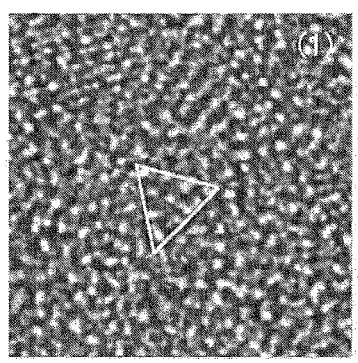 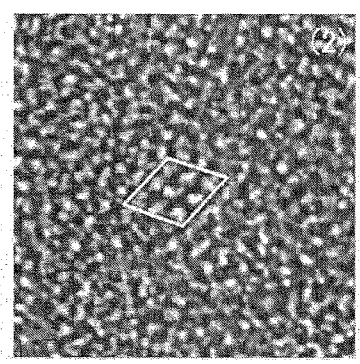 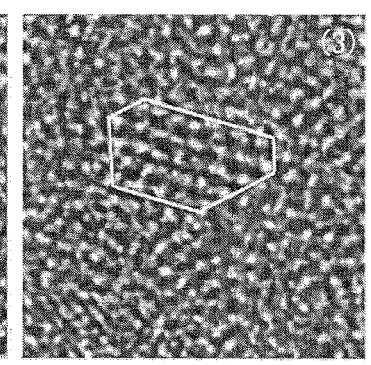

Electron beam is incident on a sample in a direction parallel to the sample surface.

Electron beam is incident on a sample in a direction perpendicular to the sample surface.

SEMICONDUCTOR DEVICE

CROSS-REFERENCE TO RELATED APPLICATIONS

This application is a continuation of U.S. application Ser. No. 14/580,651, filed Dec. 23, 2014, now allowed, which claims the benefit of a foreign priority application filed in Japan as Serial No. 2013-270926 on Dec. 27, 2013, both of which are incorporated by reference.

BACKGROUND OF THE INVENTION

1. Field of the Invention

The present invention relates to an object, a method, or a manufacturing method. Furthermore, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. The present invention relates to a method for manufacturing a semiconductor, a semiconductor device, a display device, a light-emitting device, a lighting device, a power storage device, a memory device, or a processor. The present invention relates to a method for driving a semiconductor device, a display device, a light-emitting device, a lighting device, a power storage device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

Whether amorphous silicon, polycrystalline silicon, single crystal silicon, or the like is used as a semiconductor in a transistor depends on the purpose. For example, in the case of a transistor included in a large display device, amorphous silicon, which can be formed using an established technique for forming a film over a large-sized substrate, is preferably used. On the other hand, in the case of a transistor included in a high-performance display device where driver circuits are formed over the same substrate, polycrystalline silicon, which can form a transistor having high field-effect mobility, is preferably used. In the case of using a transistor included in an integrated circuit or the like, it is preferable to use single crystal silicon having higher field-effect mobility. As a method for forming polycrystalline silicon, high-temperature heat treatment or laser light treatment which is performed on amorphous silicon has been known.

In recent years, an oxide semiconductor has attracted attention. An oxide semiconductor can be formed by a sputtering method or the like, and thus can be used for a semiconductor of a transistor in a large-sized display device. A transistor including an oxide semiconductor has high field-effect mobility; therefore, a high-performance display device where driver circuits are formed over the same substrate can be obtained. In addition, there is an advantage that capital investment can be reduced because part of production equipment for a transistor including amorphous silicon can be retrofitted and utilized.

As a method for providing a transistor including an oxide semiconductor with stable electrical characteristics, a technique where an insulator in contact with an oxide semiconductor is doped with oxygen is disclosed (see Patent Document 1). The technique disclosed in Patent Document 1 enables oxygen vacancies in an oxide semiconductor to be reduced. As a result, variation in electrical characteristics of a transistor including an oxide semiconductor can be reduced and reliability can be improved.

A transistor including an oxide semiconductor is known to have an extremely low leakage current in an off state. For example, a low-power CPU and the like utilizing the leakage current of a transistor including an oxide semiconductor are disclosed (see Patent Document 2).

Patent Document 3 discloses that a transistor having high field-effect mobility can be obtained by a well potential formed using an active layer formed of a semiconductor.

REFERENCE

Patent Document

[Patent Document 1] Japanese Published Patent Application No. 2011-243974
[Patent Document 2] Japanese Published Patent Application No. 2012-257187
[Patent Document 3] Japanese Published Patent Application No. 2012-59860

SUMMARY OF THE INVENTION

An object is to provide a transistor with stable electrical characteristics. Another object is to provide a transistor with a low off-state current. Another object is to provide a transistor with a high on-state current. Another object is to provide a semiconductor device including the transistor. Another object is to provide a durable semiconductor device. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is a semiconductor device including a first transistor using silicon, an aluminum oxide film over the first transistor, and a second transistor using an oxide semiconductor over the aluminum oxide film. The oxide semiconductor has a lower hydrogen concentration than the silicon.

(2) Another embodiment of the present invention is the semiconductor device according to (1) in which the aluminum oxide film includes a region whose density is less than 3.2 g/cm$^3$ measured by an X-ray reflectivity method.

(3) Another embodiment of the present invention is the semiconductor device according to (1) or (2) in which an insulator containing excess hydrogen is provided between the first transistor and the aluminum oxide film.

(4) Another embodiment of the present invention is the semiconductor device according to any one of (1) to (3) in which an insulator containing excess oxygen is between the aluminum oxide film and the second transistor.

(5) Another embodiment of the present invention is the semiconductor device according to (4) in which the second transistor includes a back gate electrode including a region over which the oxide semiconductor is between the aluminum oxide film and the insulator containing excess oxygen.

(6) Another embodiment of the present invention is the semiconductor device according to (5) in which the back gate electrode has a stacked-layer structure including a layer containing oxide or oxynitride.

Note that in the semiconductor device of one embodiment of the present invention, the oxide semiconductor may be replaced with another semiconductor.

A transistor having stable electrical characteristics can be provided. A transistor with a low off-state current can be provided. A transistor with a high on-state current can be provided. A semiconductor device including the transistor can be provided. A durable semiconductor device can be provided. A novel semiconductor device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 18A, 18B, 18C1, and 18C2 are cross-sectional views illustrating a method for manufacturing the transistor of one embodiment of the present invention.

FIGS. 31A1, 31A2, 31A3, 31B1, 31B2, 32C1, and 31C2 each illustrate an electronic device of an embodiment of the present invention.

FIGS. 32A to 32D are Cs-corrected high-resolution TEM images of a cross section of a CAAC-OS and a cross-sectional schematic view of the CAAC-OS.

FIGS. 33A to 33D are Cs-corrected high-resolution TEM images of a plane of a CAAC-OS.

DETAILED DESCRIPTION OF THE INVENTION

Figure 1:
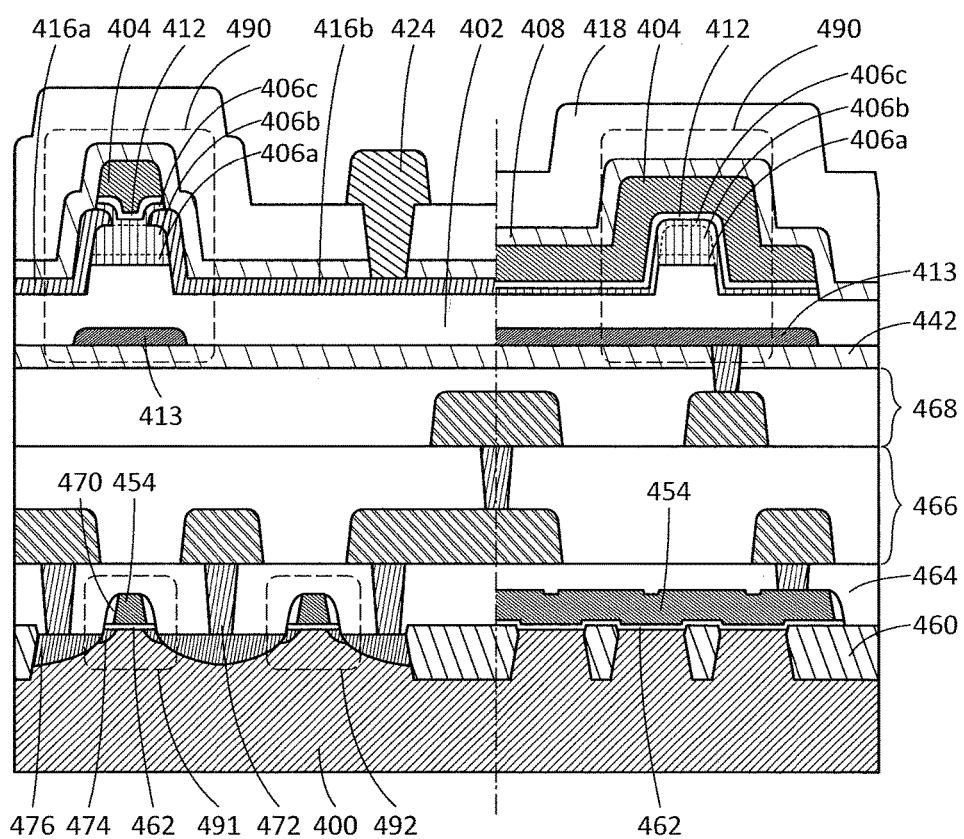
FIG. 1 is a cross-sectional view illustrating a semiconductor device of one embodiment of the present invention.

Hereinafter, embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases. In the case where the description of a component denoted by a different reference numeral is referred to, the description of the thickness, the composition, the structure, or the shape of the component can be used as appropriate.

Note that the size, the thickness of films (layers), or regions in diagrams may be exaggerated for clarity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

Note that in the embodiments described below, an insulator may be formed to have, for example, a single-layer structure or a stacked-layer structure including an insulator containing one or more of boron, carbon, nitrogen, oxygen, fluorine, magnesium, aluminum, silicon, phosphorus, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be formed in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

Furthermore, in the embodiments described below, a conductor may be formed to have, for example, a single-layer structure or a stacked-layer structure including a conductor containing one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten unless otherwise specified. Alternatively, an alloy or a compound containing the above element may be used: a conductor containing aluminum, a conductor containing copper and titanium, a conductor containing copper and manganese, a conductor containing indium, tin, and oxygen, a conductor containing titanium and nitrogen, or the like may be used.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

<Structure of Semiconductor Device>

A structure of a semiconductor device of one embodiment of the present invention is described below.

FIG. 1 is a cross-sectional view of a semiconductor device of one embodiment of the present invention. FIG. 1 shows different cross sections on the left side and the right side of a dashed-dotted line.

The semiconductor device illustrated in FIG. 1 includes a transistor 491, an insulator (insulating layer) 442 over the transistor 491, and a transistor 490 over the insulator 442. The insulator 442 has a function of blocking oxygen and hydrogen.

The transistor 491 includes an insulator 462 over a semiconductor substrate 400, a conductor (conductive layer) 454 over the insulator 462, an insulator 470 in contact with a side surface of the conductor 454, a region 476 of the semiconductor substrate 400 over which the conductor 454 and the insulator 470 are not provided, and a region 474 of the semiconductor substrate 400 over which the insulator 470 is provided.

For the semiconductor substrate 400, a single-material semiconductor of silicon, germanium, or the like or a compound semiconductor of silicon carbide, silicon germanium, gallium arsenide, gallium nitride, indium phosphide, zinc oxide, gallium oxide, or the like may be used, for example. For the semiconductor substrate 400, an amorphous semiconductor or a crystalline semiconductor may be used, and examples of a crystalline semiconductor include a single crystal semiconductor, a polycrystalline semiconductor, and a microcrystalline semiconductor.

The insulator 462 serves as a gate insulator of the transistor 491. The conductor 454 serves as a gate electrode of the transistor 491. The insulator 470 serves as a sidewall insulator (also referred to as a sidewall) of the conductor 454. The region 476 serves as a source region or a drain region of the transistor 491. The region 474 serves as a lightly doped drain (LDD) region of the transistor 491.

The region 474 can be formed by adding an impurity using the conductor 454 as a mask. After that, the insulator 470 is formed and an impurity is added using the conductor 454 and the insulator 470 as masks, so that the region 476 can be formed. Thus, when the region 474 and the region 476 are formed using the same kind of impurities, the region 474 has a lower impurity concentration than the region 476.

When the transistor 491 includes the region 474, a short-channel effect can be suppressed. Therefore, such a structure is suitable for miniaturization.

The transistor 491 is kept away from another transistor provided in the semiconductor substrate 400 by an insulator 460 or the like. Although FIG. 1 shows an example where the insulator 460 is formed by a shallow trench isolation (STI) method, one embodiment of the present invention is not limited thereto. For example, instead of the insulator 460, an insulator formed by a local oxidation of silicon (LOCOS) method may be used so that transistors are separated from each other.

FIG. 1 shows an example where the transistor 492 having the same conductivity type as the transistor 491 is provided to be adjacent to the transistor 491. Furthermore, in FIG. 1, the transistor 491 and the transistor 492 are electrically connected to each other through the region 476. The transistor 491 and the transistor 492 may have different conductivity types. In that case, the transistors 491 and 492 may be separated from each other by the insulator 460, depending on the transistors 491 and 492, different kinds of impurities contained in the region 474 and the region 476 are used, and well regions having different conductivity types may be framed in part of a region of the semiconductor substrate 400 over which the conductor serving as one or both of gate electrodes of the transistors 491 and 492.

When the transistors 491 and 492 have different conductivity types, a complementary metal oxide semiconductor (CMOS) can be formed. With a CMOS, power consumption of the semiconductor device can be reduced. Furthermore, operation speed can be increased.

Note that the structures of the transistors 491 and 492 are not limited to the structures illustrated in FIG. 1. For example, a structure where the semiconductor substrate 400 has a projection (also referred to as a protrusion or a fin), like the transistors 491 and 492 illustrated in FIG. 2, may be used. In the structures of the transistors 491 and 492 illustrated in FIG. 2, an effective channel width with respect to the occupation area can be increased as compared with those illustrated in FIG. 1. Thus, the on-state currents of the transistors 491 and 492 can be increased.

Figure 3:
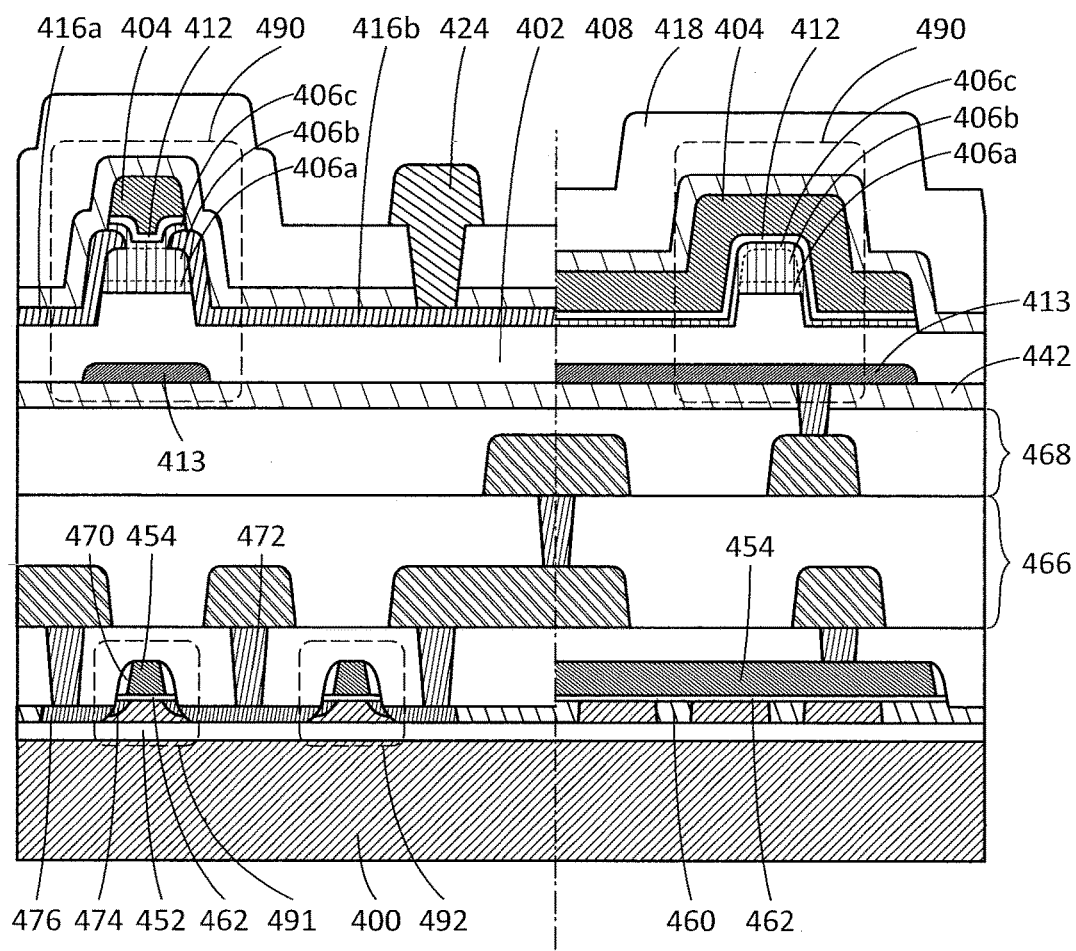
FIG. 3 is a cross-sectional view illustrating a semiconductor device of one embodiment of the present invention.

Alternatively, for example, a structure where an insulator region 452 is provided in the semiconductor substrate 400, like the transistors 491 and 492 illustrated in FIG. 3, may be used. With the structures of the transistors 491 and 492 illustrated in FIG. 3, transistors which independently operate can be separated from each other more surely and thus, leakage current can be suppressed. Consequently, the off-state currents of the transistors 491 and 492 can be low. Furthermore, the on-state currents of the transistors 491 and 492 can be high.

The transistor 490 illustrated in FIG. 1 includes a conductor 413; an insulator 402 over the conductor 413; a semiconductor (semiconductor layer) 406*a* over the insulator 402; a semiconductor 406*b* over the semiconductor 406*a*; a conductor 416*a* and a conductor 416*b* in contact with side surfaces of the semiconductor 406*a* and a top surface and side surfaces of the semiconductor 406*b*; a semiconductor 406*c* in contact with the side surfaces of the semiconductor 406*a*, the top surface and the side surfaces of the semiconductor 406*b*, a top surface and side surfaces of the conductor 416*a*, and a top surface and side surfaces of the conductor 416*b*; an insulator 412 over the semiconductor 406*c*; and a conductor 404 over the insulator 412. Although the conductor 413 is part of the transistor 490 here, one embodiment of the present invention is not limited thereto. For example, the conductor 413 may be a component independent of the transistor 490.

The conductor 413 serves as a gate electrode of the transistor 490. The insulator 402 serves as a gate insulator of the transistor 490. The conductor 416*a* and the conductor 416*b* serve as a source electrode and a drain electrode of the transistor 490. The insulator 412 serves as a gate insulator of the transistor 490. The conductor 404 serves as a gate electrode of the transistor 490.

Figure 4:
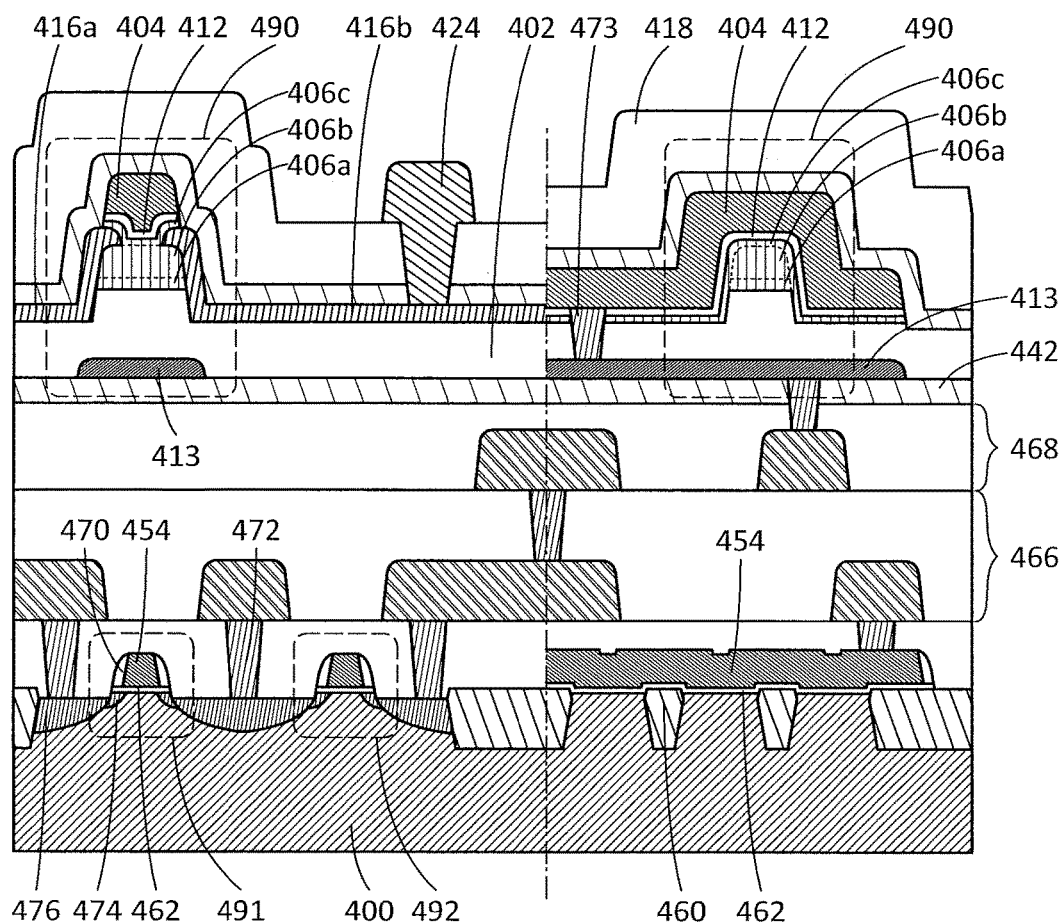
FIG. 4 is a cross-sectional view illustrating a semiconductor device of one embodiment of the present invention.

The conductor 413 and the conductor 404 serve as gate electrodes of the transistor 490, and may be supplied with different potentials. For example, by applying a negative or positive gate voltage to the conductor 413, the threshold voltage of the transistor 490 may be controlled. Alternatively, as illustrated in FIG. 4, the conductor 413 and the conductor 404 may be electrically connected to each other through the conductor 473 or the like and thus may be supplied with the same potential. In this case, the on-state current of the transistor 490 can be increased because the effective channel width can be increased. By the conductor 413, an electric field can be supplied to also a region which an electric field is difficult to reach in the case of using only the conductor 404; thus, the subthreshold swing value (also referred to as an S value) of the transistor 490 can be small. Accordingly, the off-state current of the transistor 490 can be low.

Figure 5:
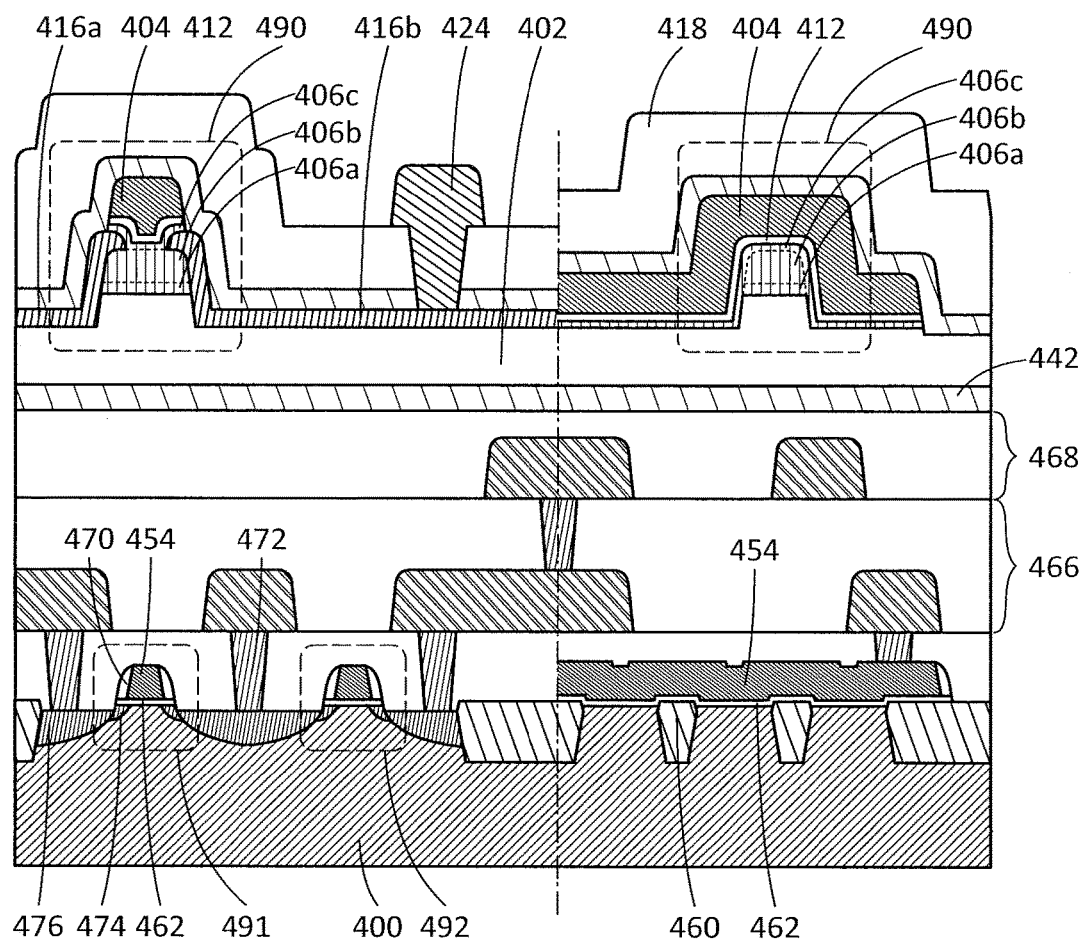
FIG. 5 is a cross-sectional view illustrating a semiconductor device of one embodiment of the present invention.

Alternatively, as illustrated in FIG. 5, the transistor 490 does not necessarily include the conductor 413.

The insulator 402 is preferably an insulator containing excess oxygen.

The insulator containing excess oxygen means an insulator from which oxygen is released by heat treatment, for example. The silicon oxide containing excess oxygen means silicon oxide which can release oxygen by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such oxygen vacancies and forms electrons serving as carriers. Therefore, by reducing the oxygen vacancies in the semiconductor 406b, the transistor 490 can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in thermal desorption spectroscopy (TDS) analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass number of 32 which are obtained in the TDS analysis are assumed to originate from an oxygen molecule. Note that CH$_3$OH, which is a gas having the mass number of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2}=N_{H2}/S_{H2}\times S_{O2}\times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value a is a coefficient affecting the ion intensity in the TDS analysis. Refer to Japanese Published Patent Application No. H6-275697 for details of the above formula. The amount of released oxygen was measured with a thermal desorption spectroscopy apparatus produced by ESCO Ltd., EMD-WA1000S/W using a silicon substrate containing hydrogen atoms at $1\times10^{16}$ atoms/cm$^2$ as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above a includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5\times10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide (SiO$_X$ (X>2)). In the oxygen-excess silicon oxide (SiO$_X$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 1, the side surfaces of the conductors 416a and 416b are in contact with the side surfaces of the semiconductor 406b. The semiconductor 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed in a top view. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

In this specification, the term' "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

A structure of an oxide semiconductor which can be used as the semiconductor 406a, the semiconductor 406b, the semiconductor 406c, or the like is described below. In this specification, the trigonal and rhombohedral crystal systems are included in the hexagonal crystal system.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

<CAAC-OS>

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 32A:
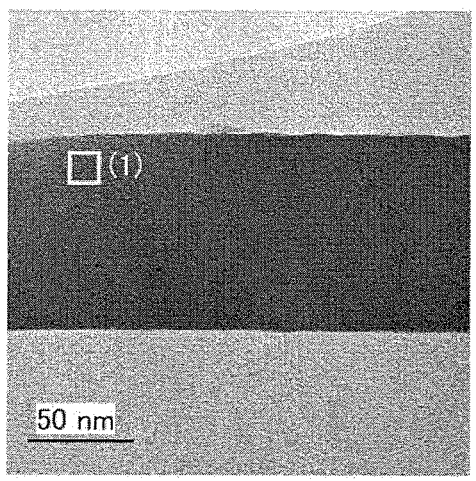

A CAAC-OS observed with TEM is described below. FIG. 32A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 32B:
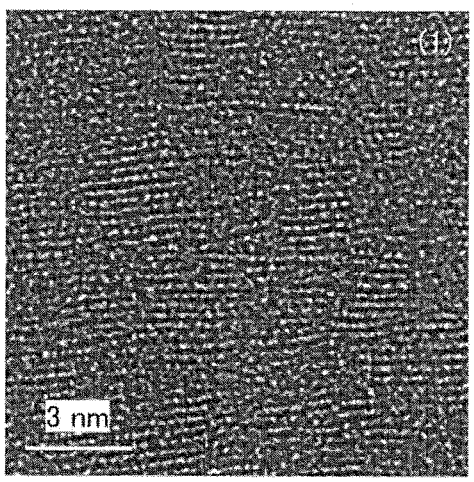

FIG. 32B is an enlarged Cs-corrected high-resolution TEM image of a region (1) in FIG. 32A. FIG. 32B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 32C:
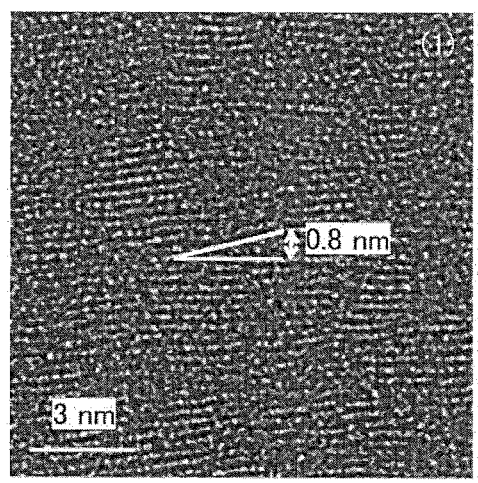

As shown in FIG. 32B, the CAAC-OS has a characteristic atomic arrangement. The characteristic atomic arrangement is denoted by an auxiliary line in FIG. 32C. FIGS. 32B and 32C prove that the size of a pellet is approximately 1 nm to 3 nm, and the size of a space caused by tilt of the pellets is approximately 0.8 nm. Therefore, the pellet can also be referred to as a nanocrystal (nc).

Figure 32D:
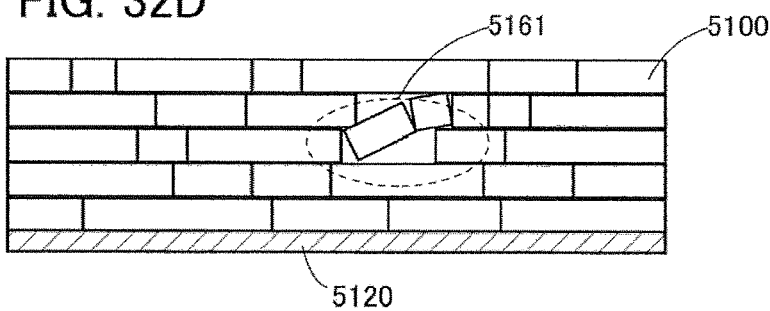

Here, according to the Cs-corrected high-resolution TEM images, the schematic arrangement of pellets 5100 of a CAAC-OS over a substrate 5120 is illustrated by such a structure in which bricks or blocks are stacked (see FIG. 32D). The part in which the pellets are tilted as observed in FIG. 32C corresponds to a region 5161 shown in FIG. 32D.

FIG. 33A shows a Cs-corrected high-resolution TEM image of a plane of the CAAC-OS observed from a direction substantially perpendicular to the sample surface. FIGS.

33B, 33C, and 33D are enlarged Cs-corrected high-resolution TEM images of regions (1), (2), and (3) in FIG. 33A, respectively. FIGS. 33B, 33C, and 33D indicate that metal atoms are arranged in a triangular, quadrangular, or hexagonal configuration in a pellet. However, there is no regularity of arrangement of metal atoms between different pellets.

Figure 34A:
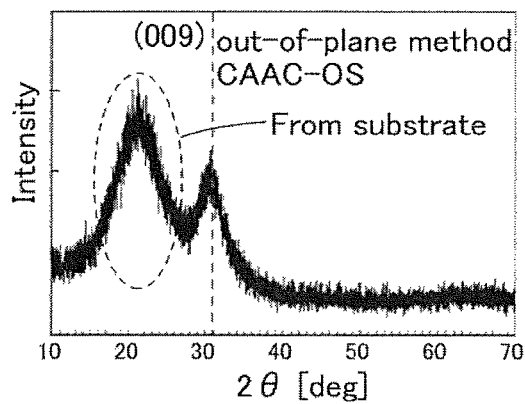
FIGS. 34A to 34C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 34A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 34B:
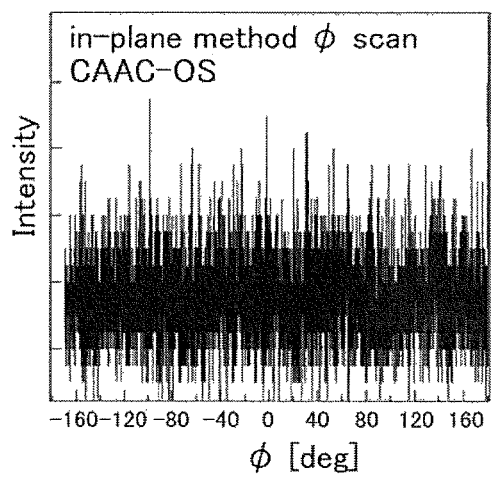
Figure 34C:
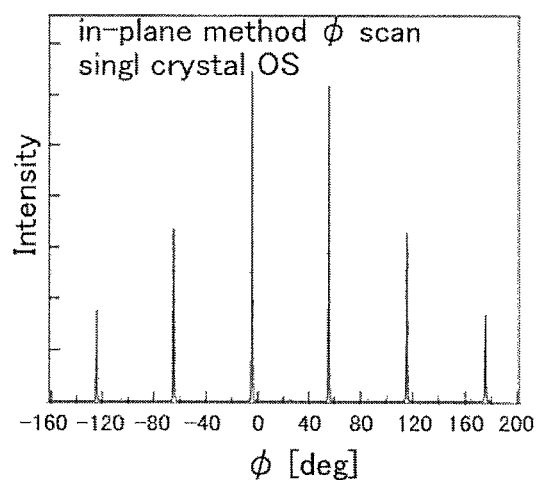

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 34B, a peak is not clearly observed. In contrast, in the case of a single crystal oxide semiconductor of InGaZnO$_4$, when φ scan is performed with 2θ fixed at around 56°, as shown in FIG. 34C, six peaks which are derived from crystal planes equivalent to the (110) plane are observed. Accordingly, the structural analysis using XRD shows that the directions of a-axes and b-axes are different in the CAAC-OS.

Figure 35A:
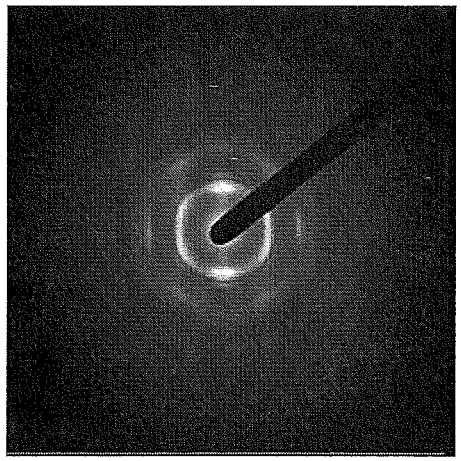
FIGS. 35A and 35B show electron diffraction patterns of a CAAC-OS.
Figure 35B:
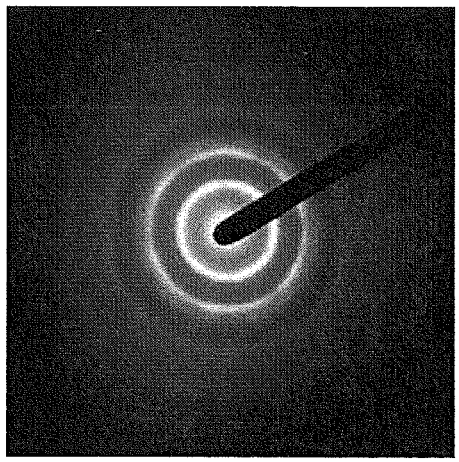

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 35A might be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 35B shows a diffraction pattern obtained in such a manner that an electron beam with a probe diameter of 300 nm is incident on the same sample in a direction perpendicular to the sample surface. As shown in FIG. 35B, a ring-like diffraction pattern is observed. Thus, the electron diffraction also indicates that the a-axes and b-axes of the pellets included in the CAAC-OS do not have regular alignment. The first ring in FIG. 35B is considered to be derived from the (010) plane, the (100) plane, and the like of the InGaZnO$_4$ crystal. The second ring in FIG. 35B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small amount of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small amount of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be a highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

The CAAC-OS having small amounts of impurities and oxygen vacancies is an oxide semiconductor with low carrier density (specifically, lower than $8 \times 10^{11}$/cm$^3$, preferably lower than $1 \times 10^{11}$/cm$^3$, further preferably lower than $1 \times 10^{11}$/cm$^3$, and is higher than or equal to $1 \times 10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases. Also in a nanobeam electron di faction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 36:
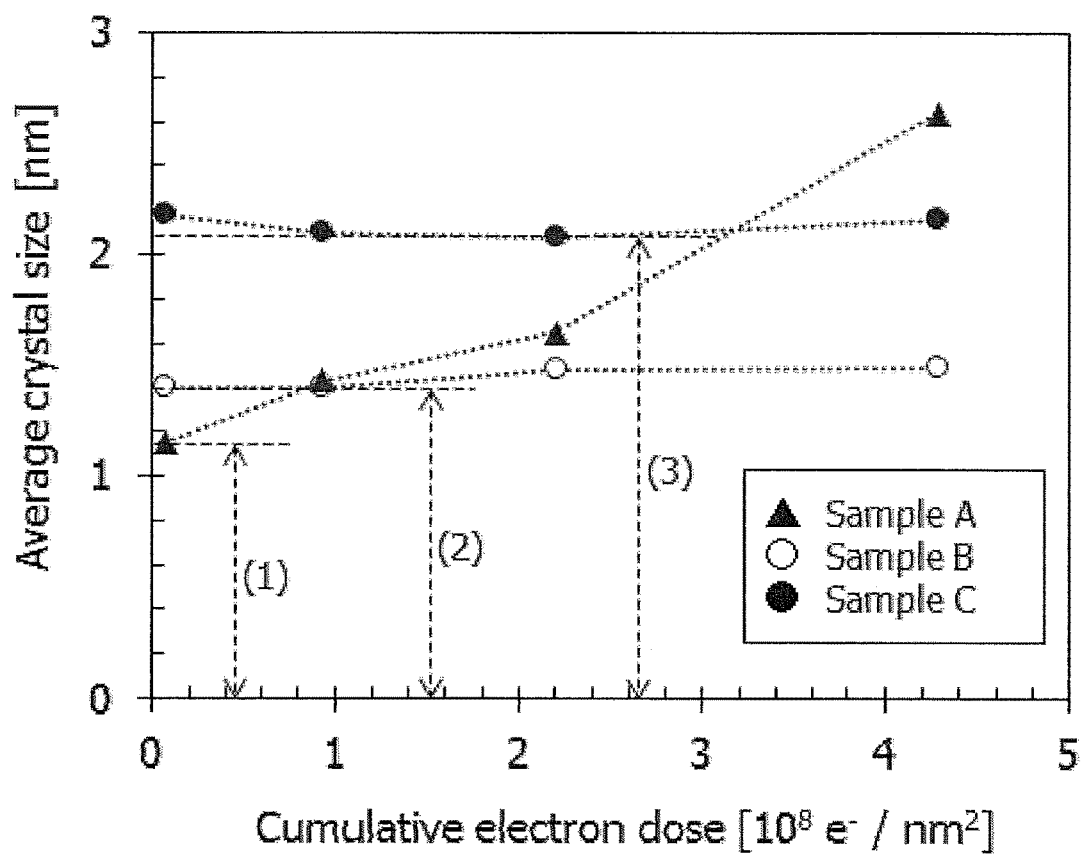
FIG. 36 shows change of crystal parts of an In—Ga—Zn oxide owing to electron irradiation.

FIG. 36 shows change in the average size of crystal parts (at 22 points to 45 points) in each sample. Note that the crystal part size corresponds to the length of a lattice fringe. FIG. 36 indicates that the crystal part size in the a-like OS increases with an increase in the cumulative electron dose. Specifically, as shown by (1) in FIG. 36, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 36, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

The above oxide semiconductor can be used as the semiconductor 406a, the semiconductor 406b, the semiconductor 406c, or the like.

Next, the other components of a semiconductor which can be used as the semiconductor 406a, the semiconductor 406b, the semiconductor 406c, or the like are described.

The semiconductor 406b is an oxide semiconductor containing indium, for example. An oxide semiconductor can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be forming at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In—Al—Zn oxide as the semiconductor 406a, when summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the semiconductor 406b, when summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the semiconductor 406c, when summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 406b having the highest electron affinity in the semiconductor 406a, the semiconductor 406b, and the semiconductor 406c.

Figure 37A:
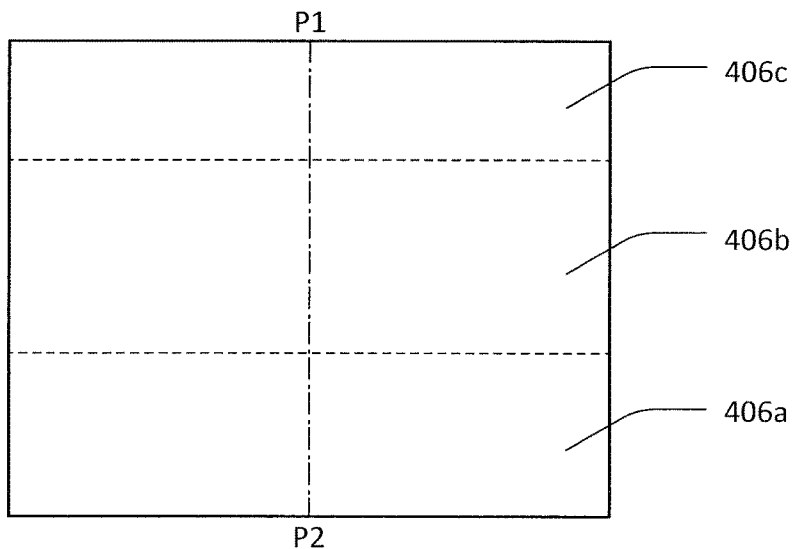
FIGS. 37A to 37C are a cross-sectional view illustrating a stack of semiconductors and band diagrams.
Figure 37B:
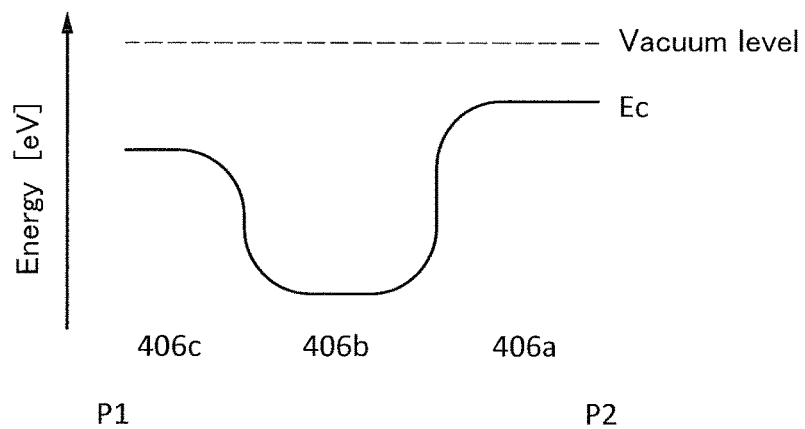
Figure 37C:
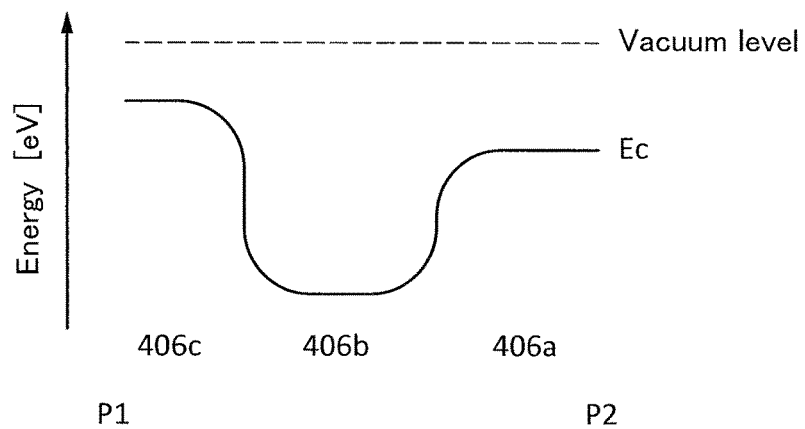

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For that reason, the stack of the semiconductor 406a, the semiconductor 406b, and the semiconductor 406c has a band diagram where energy at each interface and in the vicinity of the interface is changed continuously (continuous junction). Note that FIG. 37A is a cross-sectional view in which the semiconductor 406a, the semiconductor 406b, and the semiconductor 406c are stacked in this order. FIG. 37B shows energy (Ec) of the bottom of the conduction band corresponding to dashed-dotted line P1-P2 in FIG. 37A when the semiconductor 406c has a higher electron affinity than the semiconductor 406a. FIG. 37C shows energy (Ec) of the bottom of the conduction band corresponding to dashed-dotted line P1-P2 in FIG. 37A when the semiconductor 406c has a lower electron affinity than the semiconductor 406a.

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-state current of the transistor 490 can be increased.

As factors of inhibiting electron movement are decreased, the on-state current of the transistor 490 can be increased. For example, in the case where there is no factor of inhibiting electron movement, electrons are assumed to be efficiently moved. Electron movement is inhibited, for example, in the case where physical unevenness of a channel formation region is large.

Therefore, to increase the on-state current of the transistor 490, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case were the semiconductor 406b contains oxygen vacancies (also denoted by $V_O$), donor levels are formed by entry of hydrogen into sites of oxygen vacancies in some cases. A state in which hydrogen enters sites of oxygen vacancies are denoted by VoH in the following description in some cases. VoH is a factor of decreasing the on-state current of the transistor 490 because VoH scatters electrons. Note that sites of oxygen vacancies become more stable by entry of oxygen than by entry of hydrogen. Thus, by decreasing oxygen vacancies in the semiconductor 406b, the on-state current of the transistor 490 can be increased in some cases.

To decrease oxygen vacancies in the semiconductor 406b, for example, there is a method in which excess oxygen in the insulator 402 is moved to the semiconductor 406b through the semiconductor 406a. In this case, the semiconductor 406a is preferably a layer having an oxygen-transmitting property (a layer through which oxygen passes or is transmitted).

Oxygen is released from the insulator 402 and taken into the semiconductor 406a by heat treatment or the like. In some cases, oxygen exists and is apart from atomics in the semiconductor 406a, or exists and is bonded to oxygen or the like. As the density becomes lower, i.e., the number of spaces between the atoms becomes larger, the semiconductor 406a has a higher oxygen-transmitting property. For example, in the case where the semiconductor 406a has a layered crystal structure and oxygen movement in which oxygen crosses the layer is less likely to occur, the semiconductor 406a is preferably a layer having low crystallinity as appropriate.

The semiconductor 406a preferably has crystallinity such that excess oxygen (oxygen) is transmitted so that excess oxygen (oxygen) released from the insulator 402 reaches the semiconductor 406b. For example, in the case where the semiconductor 406a is a CAAC-OS, a structure in which a space is partly provided in the layer is preferably employed because when the whole layer becomes CAAC, excess oxygen (oxygen) cannot be transmitted. For example, the proportion of CAAC of the semiconductor 406a is lower than 100%, preferably lower than 98%, more preferably lower than 95%, still more preferably lower than 90%. Note that to reduce the interface state density at the interface between the semiconductor 406a and the semiconductor 406b, the proportion of CAAC of the semiconductor 406a is higher than or equal to 10%, preferably higher than or equal to 20%, more preferably higher than or equal to 50%, still more preferably higher than or equal to 70%.

In the case where the transistor 490 has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor 490 is. For example, the semiconductor 406b has a region with a thickness of greater than or equal to 20 nm, preferably greater than or equal to 40 nm, more preferably greater than or equal to 60 nm, still more preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased.

Moreover, the thickness of the semiconductor 406c is preferably as small as possible to increase the on-state current of the transistor 490. The thickness of the semiconductor 406c is less than 10 nm, preferably less than or equal to 5 nm, more preferably less than or equal to 3 nm, for example. Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by secondary ion mass spectrometry (SIMS) is provided between the semiconductor 406b and the semiconductor 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

At least part (or all) of the conductor 416a (and/or the conductor 416b) is provided on at least part (or all) of a surface, a side surface, a top surface, and/or a bottom surface of a semiconductor, e.g., the semiconductor 406b.

Alternatively, at least part (or all) of the conductor 416a (and/or the conductor 416b) is in contact with at least part (or all) of a surface, a side surface, a top surface, and/or a bottom surface of a semiconductor, e.g., the semiconductor 406b. Alternatively, at least part (or all) of the conductor 416a (and/or the conductor 416b) is in contact with at least part (or all) of a semiconductor, e.g., the semiconductor 406b.

Alternatively, at least part (or all) of the conductor 416a (and/or the conductor 416b) is electrically connected to at least part (or all) of a surface, a side surface, a top surface, and/or a bottom surface of a semiconductor, e.g., the semiconductor 406b. Alternatively, at least part (or all) of the conductor 416a (and/or the conductor 416b) is electrically connected to at least part (or all) of a semiconductor, e.g., the semiconductor 406b.

Alternatively, at least part (or all) of the conductor 416a (and/or the conductor 416b) is provided near at least part (or all) of a surface, a side surface, a top surface, and/or a bottom surface of a semiconductor, e.g., the semiconductor 406b. Alternatively, at least part (or all) of the conductor 416a (and/or the conductor 416b) is provided near at least part (or all) of a semiconductor, e.g., the semiconductor 406b.

Alternatively, at least part (or all) of the conductor 416a (and/or the conductor 416b) is provided to be adjacent to at least part (or all) of a surface, a side surface, a top surface, and/or a bottom surface of a semiconductor, e.g., the semiconductor 406b. Alternatively, at least part (or all) of the conductor 416a (and/or the conductor 416b) is provided to be adjacent to at least part (or all) of a semiconductor, e.g., the semiconductor 406b.

Alternatively, at least part (or all) of the conductor 416a (and/or the conductor 416b) is provided obliquely above at least part (or all) of a surface, a side surface, a top surface, and/or a bottom surface of a semiconductor, e.g., the semiconductor 406b. Alternatively, at least part (or all) of the conductor 416a (and/or the conductor 416b) is provided obliquely above at least part (or all) of a semiconductor, e.g., the semiconductor 406b.

Alternatively, at least part (or all) of the conductor 416a (and/or the conductor 416b) is provided above at least part (or all) of a surface, a side surface, a top surface, and/or a bottom surface of a semiconductor, e.g., the semiconductor 406b. Alternatively, at least part (or all) of the conductor 416a (and/or the conductor 416b) is provided above at least part (or all) of a semiconductor, e.g., the semiconductor 406b.

The transistor 490 can have a variety of structures. For easy understanding, only the transistor 490 and the vicinity thereof are illustrated in FIGS. 6A and 6B, FIGS. 7A and 7B, FIGS. 8A and 8B, FIGS. 9A and 9B, FIGS. 10A to 10C, FIGS. 11A and 11B, FIGS. 12A and 12B, FIGS. 13A and 13B, FIGS. 14A and 14B, FIGS. 15A and 15B, and FIGS. 16A and 16B.

Figure 6A:
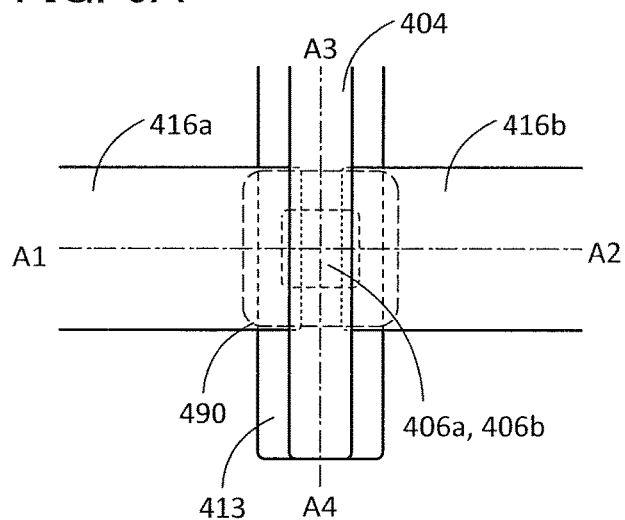
FIGS. 6A and 6B are a top view and a cross-sectional view which illustrate a transistor of one embodiment of the present invention.
Figure 6B:
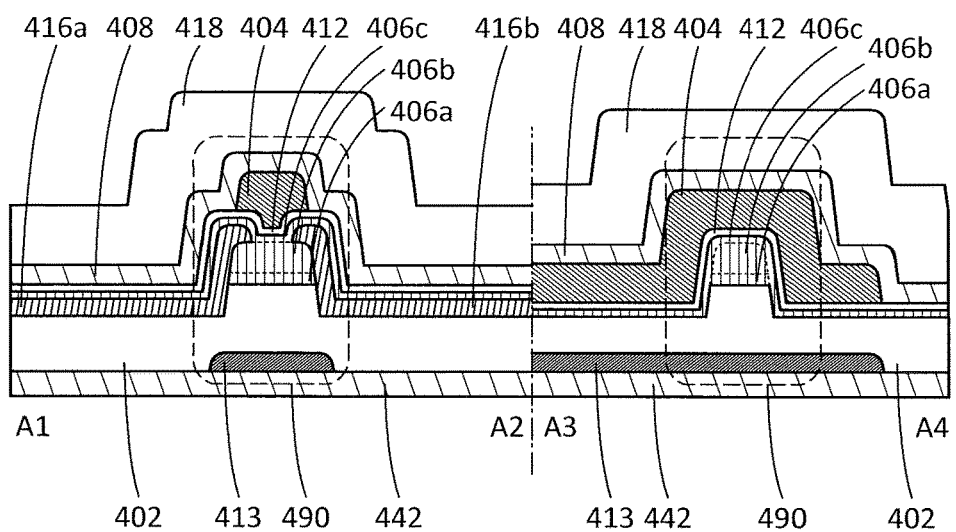

FIG. 6A is an example of a top view of the transistor 490. FIG. 6B is an example of a cross-sectional view taken along dashed-dotted line A1-A2 and dashed-dotted line A3-A4 in FIG. 6A. Note that some components such as an insulator are omitted in FIG. 6A for easy understanding.

Figure 7A:
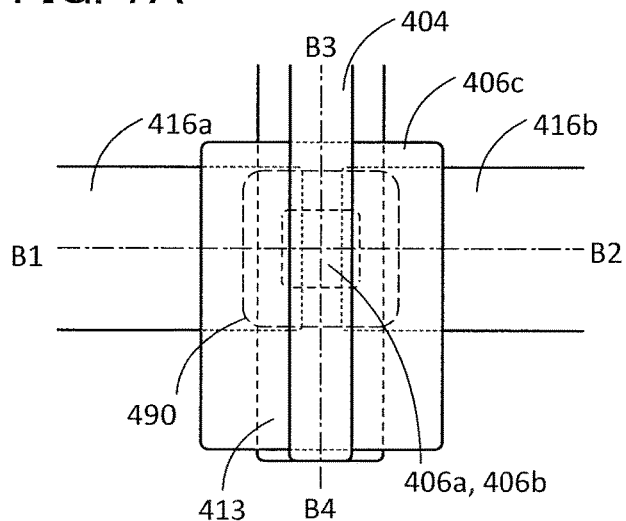
FIGS. 7A and 7B are a top view and a cross-sectional view which illustrate a transistor of one embodiment of the present invention.
Figure 7B:
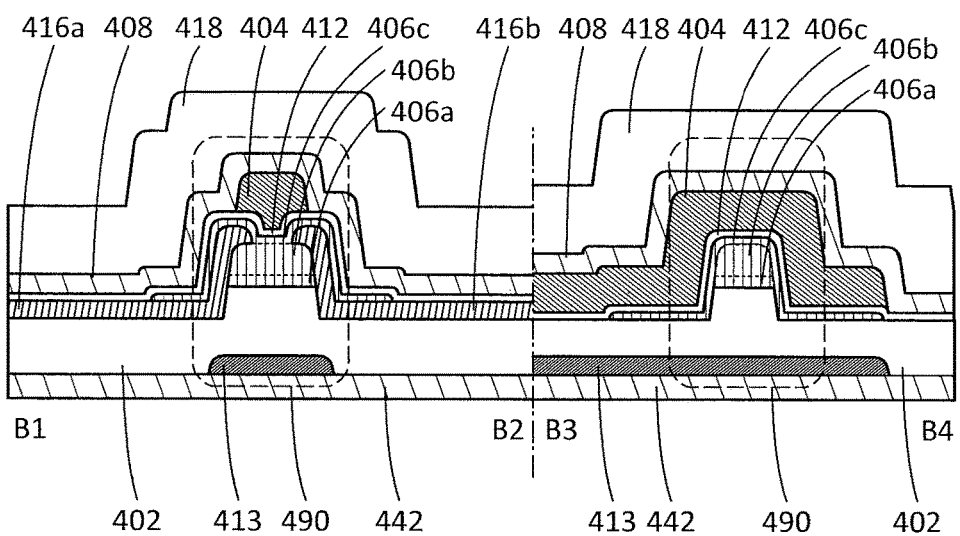

FIG. 7A is another example of the top view of the transistor 490. FIG. 7B is an example of a cross-sectional view taken along dashed-dotted line B1-B2 and dashed-dotted line B3-B4 in FIG. 7A. Note that some components such as an insulator are omitted in FIG. 7A for easy understanding.

Figure 8A:
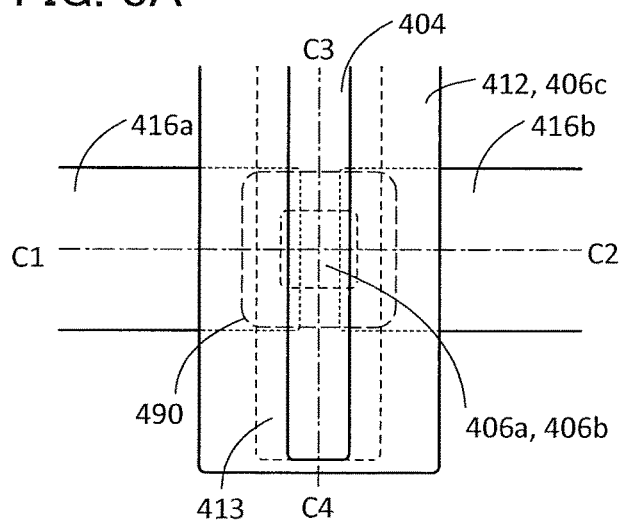
FIGS. 8A and 8B are a top view and a cross-sectional view which illustrate a transistor of one embodiment of the present invention.
Figure 8B:
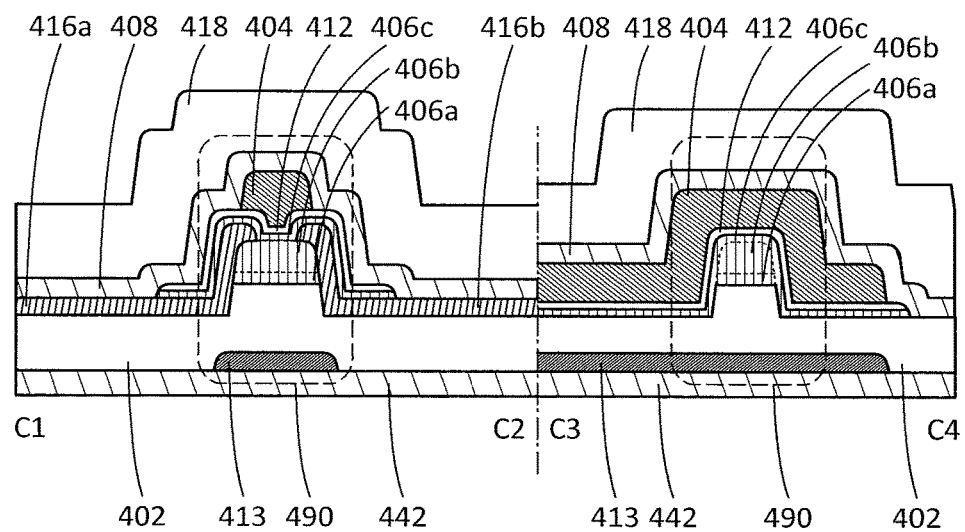

FIG. 8A is another example of the top view of the transistor 490. FIG. 8B is an example of a cross-sectional view taken along dashed-dotted line C1-C2 and dashed-dotted line C3-C4 in FIG. 8A. Note that some components such as an insulator are omitted in FIG. 8A for easy understanding.

Although FIG. 1 and the like show an example where any of the ends of the semiconductor 406c, the insulator 412, and the conductor 404 does not project, a transistor structure of one embodiment of the present invention is not limited thereto. For example, as illustrated in the top view in FIG. 6A and the cross-sectional view in FIG. 6B, the semiconductor 406c and the insulator 412 may be formed over the entire surface of the transistor. As illustrated in the top view in FIG. 7A, the semiconductor 406c may be provided to cover a channel formation region of a transistor and its periphery, and the insulator 412 may be provided over the entire surface of the transistor to cover the semiconductor 406c. In the cross-sectional view in FIG. 7B, the semiconductor 406c has a region whose end projects as compared with the conductor 404. Alternatively, as illustrated in the top view in FIG. 8A, the semiconductor 406c and the insulator 412 may be provided to cover a channel formation region of a transistor and its periphery. Note that in the cross-sectional view in FIG. 8B, ends of the semiconductor 406c and the insulator 412 each project as compared with the conductor 404.

When the transistor has any one of the structures illustrated in FIGS. 6A and 6B, FIGS. 7A and 7B, and FIGS. 8A and 8B, leakage current through a surface of the semiconductor 406c, a surface of the insulator 412, or the like can be reduced in some cases. In other words, the off-state current of the transistor can be reduced. At the time of etching of the insulator 412 and the semiconductor 406c, the conductor 404 is not necessarily used as a mask; thus, the conductor 404 is not exposed to plasma. Therefore, electrostatic damage of a transistor due to an antenna effect is less likely to occur, and thus, the semiconductor device can be manufactured with high yield. Since the degree of freedom of design of the semiconductor device is increased, the transistor is suitable for an integrated circuit such as a large scale integration (LSI) or very large scale integration (VLSI) having a complicated structure.

Figure 9A:
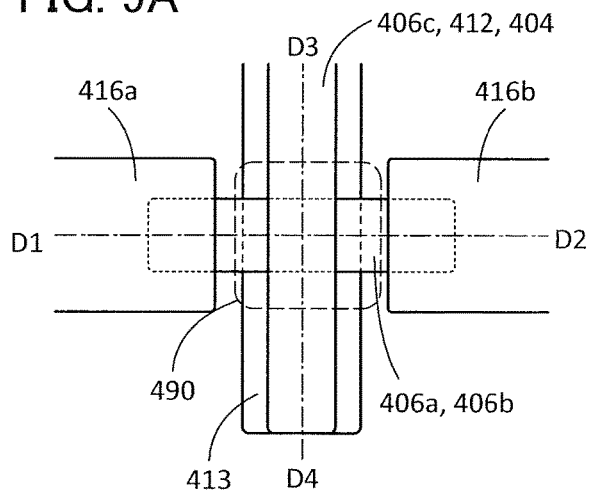
FIGS. 9A and 9B are a top view and a cross-sectional view which illustrate a transistor of one embodiment of the present invention.
Figure 9B:
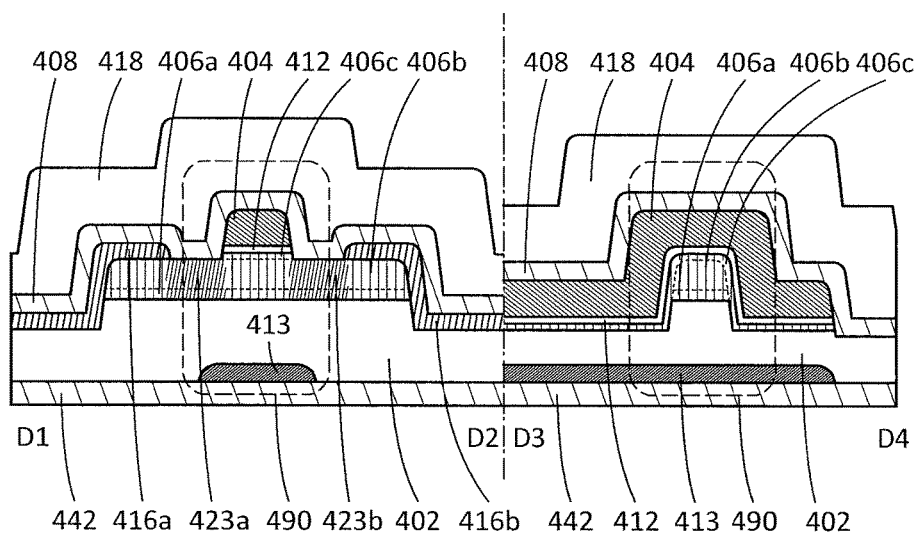

FIG. 9A is another example of the top view of the transistor 490. FIG. 9B is an example of a cross-sectional view taken along dashed-dotted line D1-D2 and dashed-dotted line D3-D4 in FIG. 9A. Note that some components such as an insulator are omitted in FIG. 9A for easy understanding.

Although FIG. 1 and the like show a structure in which a region where the conductors 416a and 416b functioning as a source electrode and a drain electrode and the conductor 404 functioning as a gate electrode overlap with each other is provided, a transistor structure of one embodiment of the present invention is not limited thereto. For example, as illustrated in FIGS. 9A and 9B, a region where the conductors 416a and 416b and the conductor 404 overlap with each other is not necessarily provided. With such a structure, a transistor with a small parasitic capacitance can be formed. Thus, a transistor with favorable switching characteristics and less noise can be obtained.

Note that the conductors 416a and 416b and the conductor 404 do not overlap with each other; thus, resistance between the conductor 416a and the conductor 416b becomes high in some cases. In such a case, the resistance is preferably as low as possible because the on-state current of the transistor might be low. For example, the distance between the conductor 416a (conductor 416b) and the conductor 404 may be made small. For example, the distance between the conductor 416a (conductor 416b) and the conductor 404 may be greater than or equal to 0 µm and less than or equal to 1 µm, preferably greater than or equal to 0 µm and less than or equal to 0.5 µm, more preferably greater than or equal to 0 µm and less than or equal to 0.2 µm, still more preferably greater than or equal to 0 µm and less than or equal to 0.1 µm.

A low-resistance region 423a (low-resistance region 423b) may be provided in the semiconductor 406b and/or the semiconductor 406a between the conductor 416a (conductor 416b) and the conductor 404. The low-resistance region 423a and the low-resistance region 423b each have, for example, a region whose carrier density is higher than that of the other region of the semiconductor 406b and/or that of the other region of the semiconductor 406a. Alternatively, the low-resistance region 423a and the low-resistance region 423b each have a region whose impurity concentration is higher than that of the other region of the semiconductor 406b and/or that of the other region of the semiconductor 406a. Alternatively, the low-resistance region 423a and the low-resistance region 423b each have a region whose carrier mobility is higher than that of the other region of the semiconductor 406b and/or that of the other region of the semiconductor 406a. The low-resistance region 423a and the low-resistance region 423b may be formed in such a manner that, for example, the conductor 404, the conductor 416a, the conductor 416b, and the like are used as masks and impurities are added to the semiconductor 406b and/or the semiconductor 406a.

The distance between the conductor 416a (conductor 416b) and the conductor 404 may be made short, and the low-resistance region 423a (low-resistance region 423b) may be provided in the semiconductor 406b and/or the semiconductor 406a between the conductor 416a (conductor 416b) and the conductor 404.

Figure 10A:
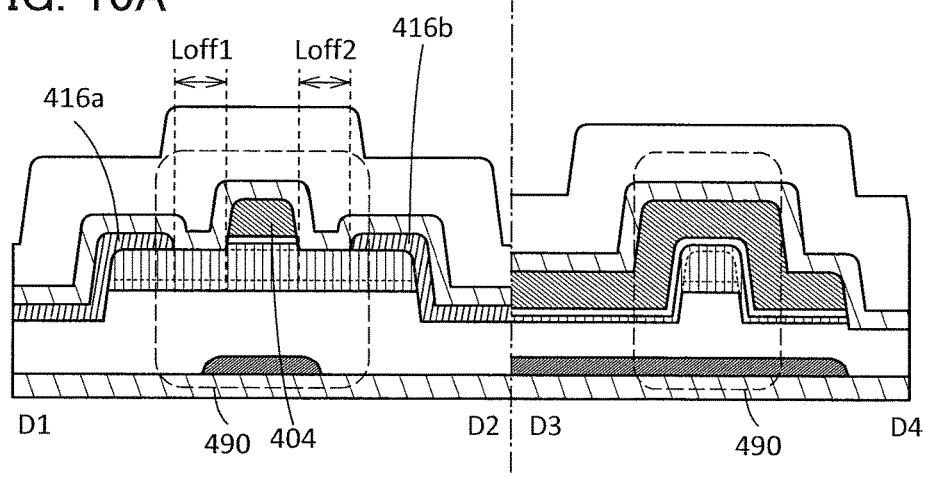
FIGS. 10A to 10C are cross-sectional views each illustrating a transistor of one embodiment of the present invention.

Alternatively, as in FIG. 10A, the transistor 490 does not necessarily include the low resistance region 423a and the low resistance region 423b, for example. In the transistor 490 without including the low resistance region 423a and the low resistance region 423b, the on-state current might be decreased but the short-channel effect can be reduced. Note that regions in FIG. 9B corresponding to the low resistance region 423a and the low resistance region 423b (a region between the conductor 416a and the conductor 404 and a region between the conductor 416b and the conductor 404) are referred to as an Loff1 region and an Loff2 region, respectively. For example, the length of each of the Loff1 region and the Loff2 region is preferably set to 50 nm or less, 20 nm or less, or 10 nm or less, in which case the on-state current of the transistor 490 hardly decreases even when the transistor 490 does not include the low resistance region 423a and the low resistance region 423b. Note that the areas of the Loff1 region and the Loff2 region may be different.

Figure 10B:
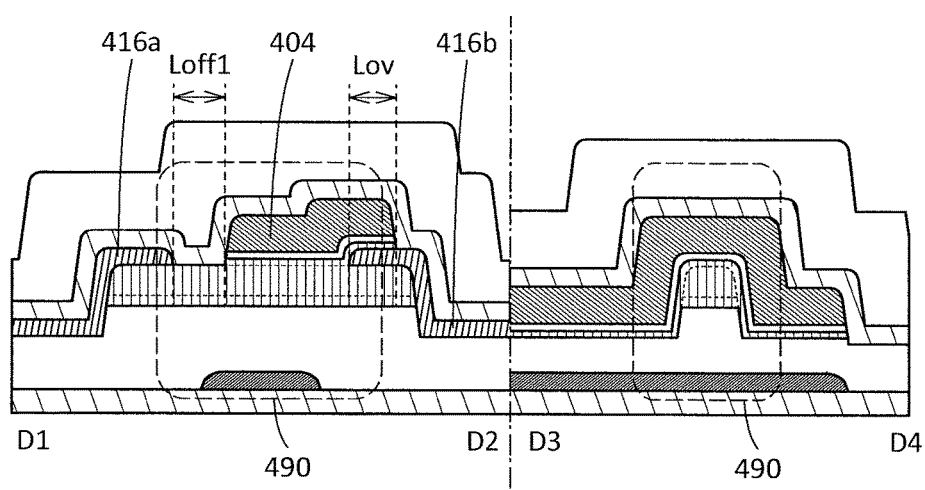

Alternatively, as in FIG. 10B, the transistor 490 may include only the Loff1 region without including the Loff2 region, for example. In the transistor 490 without including the Loff2 region, the on-state current and the short-channel effect are small. Note that a region where the conductor 416b and the conductor 404 overlap with each other is referred to as an Lov region. For example, the length of the Lov region is preferably shortened to 50 nm or less, 20 nm or less, or 10 nm or less, in which case degradation of switching characteristics of the transistor 490 due to parasitic capacitance hardly occurs.

Figure 10C:
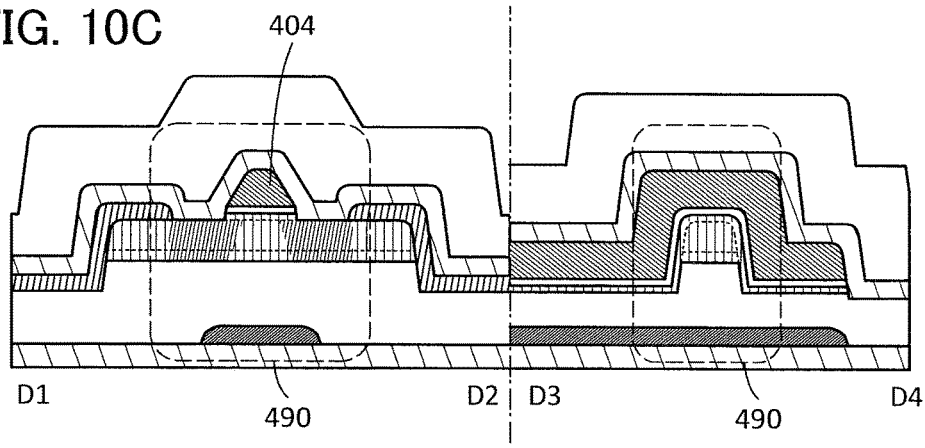

Alternatively, the conductor 404 of the transistor 490 may have a taper angle as illustrated in FIG. 10C, for example. In that case, for example, the low resistance region 423a and the low resistance region 423b have slopes in the depth direction in some cases. Note that not only in FIG. 10C but also in another drawing, the conductor 404 may have a taper angle.

Figure 11A:
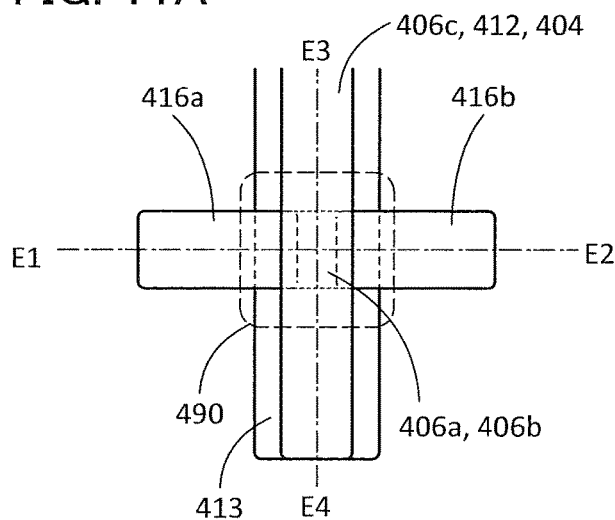
FIGS. 11A and 11B are a top view and a cross-sectional view which illustrate a transistor of one embodiment of the present invention.
Figure 11B:
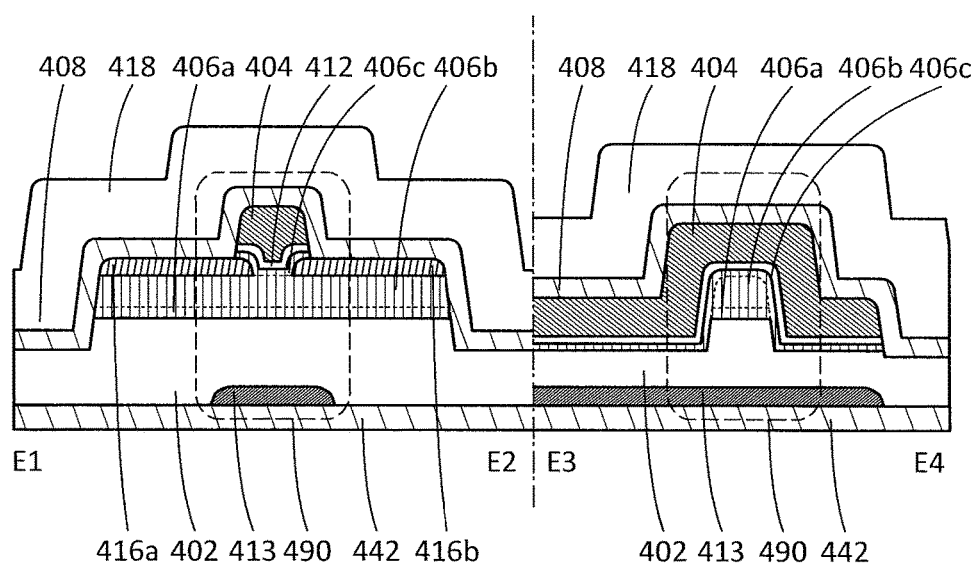

FIG. 11A is another example of the top view of the transistor 490. FIG. 11B is an example of a cross-sectional view taken along dashed-dotted line E1-E2 and dashed-dotted line E3-E4 in FIG. 11A. Note that some components such as an insulator are omitted in FIG. 11A for easy understanding.

Although FIG. 1 and the like show an example where the conductor 416a and the conductor 416b which function as a source electrode and a drain electrode are in contact with a top surface and a side surface of the semiconductor 406b, a top surface of the insulator 402, and the like, a transistor structure of one embodiment of the present invention is not limited thereto. For example, as illustrated in FIGS. 11A and 11B, the conductor 416a and the conductor 416b may be in contact with only the top surface of the semiconductor 406b.

In the transistor illustrated in FIGS. 11A and 11B, the conductor 416a and the conductor 416b are not in contact with side surfaces of the semiconductor 406b. Thus, an electric field applied from the conductor 404 functioning as a gate electrode to the side surfaces of the semiconductor 406b is less likely to be blocked by the conductor 416a and the conductor 416b. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406b. In other words, the transistor having the structure illustrated in FIGS. 11A and 11B has excellent electrical characteristics such as a high on-state current, high field-effect mobility, a small subthreshold swing value, and high reliability.

The insulator 442 illustrated in FIG. 1 and the like is provided between the transistors 491 and 492 and the transistor 490. As the insulator 442, an oxide containing aluminum, e.g., aluminum oxide, is used. The insulator 442 blocks oxygen and hydrogen, and aluminum oxide whose density is lower than 3.2 g/cm$^3$ is preferable because it has a particularly high capability of blocking hydrogen. Alternatively, aluminum oxide with low crystallinity is preferable because its capability of blocking hydrogen is particularly high.

For example, in the case where the transistor 491 and the transistor 492 are silicon transistors, electrical characteristics of the transistor may be improved because dangling bonds of silicon can be reduced by supplying hydrogen from the outside. The supply of hydrogen may be performed by heat treatment under an atmosphere containing hydrogen, for example. Alternatively, for example, an insulator containing hydrogen is provided in the vicinity of the transistors 491 and 492 and heat treatment is performed, so that the hydrogen may be diffused and supplied to the transistors 491 and 492. Specifically, an insulator 464 over the transistors 491 and 492 is preferably an insulator containing hydrogen. Note that the insulator 464 may have a single-layer structure or a stacked-layer structure. For example, a stacked-layer structure including silicon oxynitride or silicon oxide, and silicon nitride oxide or silicon nitride may be used.

An insulator containing hydrogen may release hydrogen, the amount of which is larger than or equal to $1 \times 10^{18}$ atoms/cm$^3$, larger than or equal to $1 \times 10^{19}$ atoms/cm$^3$, or larger than or equal to $1 \times 10^{20}$ atoms/cm$^3$ in TDS analysis (converted into the number of hydrogen atoms) in the range of a surface temperature of 100° C. to 700° C. or 100° C. to 500° C.

Hydrogen diffused from the insulator 464 might reach the vicinity of the transistor 490 through a conductor 472 provided in an opening of the insulator 464, a wiring layer 466 over the insulator 464, a wiring layer 468 over the wiring layer 466, or the like; however, since the insulator 442 has a function of blocking hydrogen, the amount of hydrogen which reaches the transistor 490 is small. Hydrogen serves as a carrier trap or a carrier generation source in an oxide semiconductor and causes deterioration of electrical characteristics of the transistor 490 in some cases. Therefore, blocking hydrogen by the insulator 442 is important to improve performance and reliability of the semiconductor device. Note that a conductor embedded in an opening, e.g., the conductor 472, has a function of electrically connecting elements such as transistors and capacitors. In the wiring layer 466, the wiring layer 468, and the like, a hatched region represents a conductor and a non-hatched region represents an insulator. The wiring layers, e.g., the wiring layer 466 and the wiring layer 468, have a function of electrically connecting the conductors embedded in the openings, e.g., the conductor 472 and the like.

On the other hand, for example, by supplying oxygen to the transistor 490 from the outside, oxygen vacancies in the oxide semiconductor can be reduced; thus, electrical characteristics of the transistor are improved in some cases. The supply of oxygen may be performed by heat treatment under an atmosphere containing oxygen, for example. Alternatively, for example, an insulator containing excess oxygen (oxygen) is provided in the vicinity of the transistor 490 and heat treatment is performed, so that the oxygen may be diffused and supplied to the transistor 490. Here, as the insulator 402 of the transistor 490, an insulator containing excess oxygen is used.

Diffused oxygen might reach the transistors 491 and 492 through layers; however, since the insulator 442 has a function of blocking oxygen, the amount of oxygen which reaches the transistors 491 and 492 is small. In the case where the transistors 491 and 492 are silicon transistors, entry of oxygen into silicon might be a factor of decreasing crystallinity of silicon or inhibiting carrier movement. Therefore, blocking oxygen by the insulator 442 is important to improve performance and reliability of the semiconductor device.

In FIG. 1 and the like, the semiconductor device preferably includes an insulator 408 over the transistor 490. The insulator 408 has a function of blocking oxygen and hydrogen. For the insulator 408, the description of the insulator 442 is referred to, for example. In other words, the insulator 408 can be formed of the material given as the material for the insulator 442. Alternatively, the insulator 408 has, for example, a higher capability of blocking oxygen and hydrogen than the semiconductor 406a and/or the semiconductor 406c.

When the semiconductor device includes the insulator 408, outward diffusion of oxygen from the transistor 490 can be suppressed. Consequently, excess oxygen (oxygen) contained in the insulator 402 and the like can be effectively supplied to the transistor 490. Since the insulator 408 blocks entry of impurities including hydrogen from layers above the insulator 408 or the outside of the semiconductor device, deterioration of the electrical characteristics of the transistor 490 due to the entry of impurities can be suppressed.

Although in the above description, the insulator 442 and/or the insulator 408 is described separately from the transistor 490 for convenience, the insulator 442 and/or the insulator 408 may be part of the transistor 490.

The semiconductor device may include an insulator 418 over the insulator 408. Furthermore, the semiconductor device may include a conductor 424a and a conductor 424b which are electrically connected to the transistor 490 through a conductor 426a and a conductor 426b, respectively, provided in openings of the insulator 418.

Figure 12A:
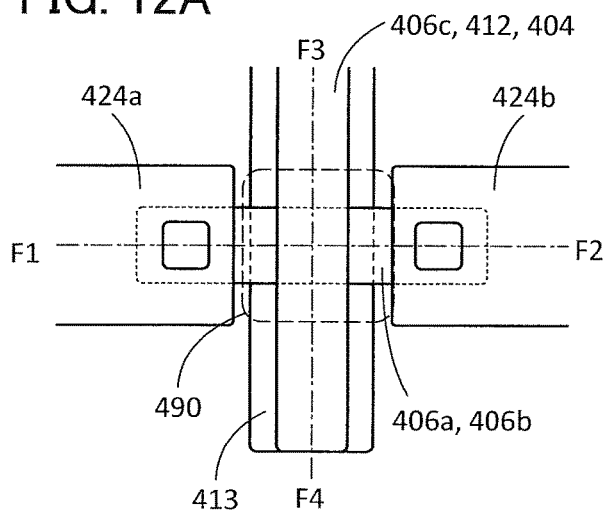
FIGS. 12A and 12B are a top view and a cross-sectional view which illustrate a transistor of one embodiment of the present invention.
Figure 12B:
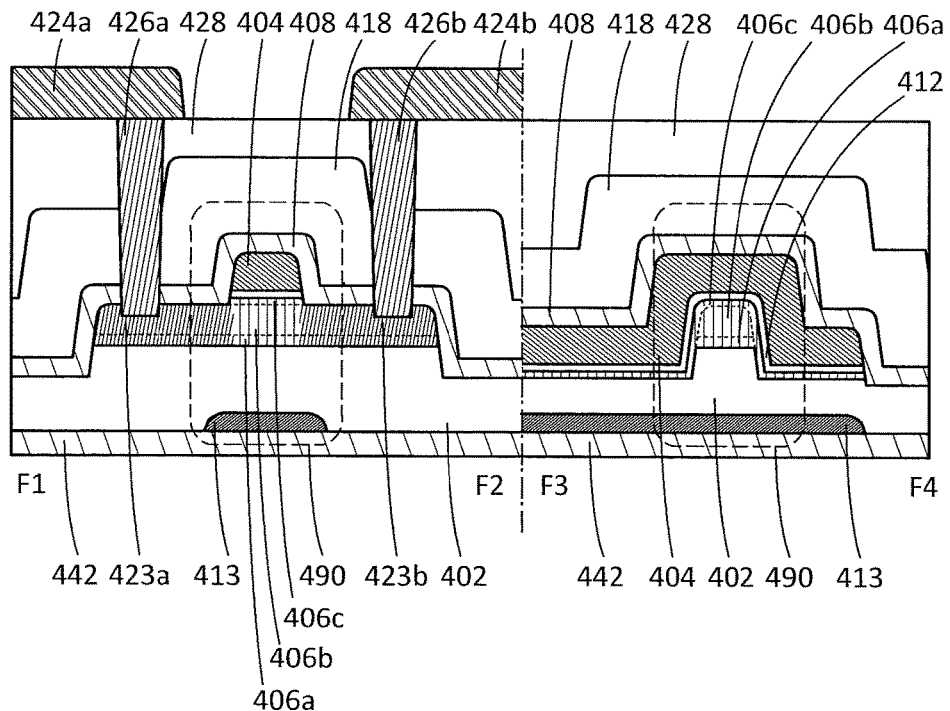

FIG. 12A is another example of the top view of the transistor 490. FIG. 12B is an example of a cross-sectional view taken along dashed-dotted line F1-F2 and dashed-dotted line F3-F4 in FIG. 12A. Note that some components such as an insulator are omitted in FIG. 12A for easy understanding.

The transistor 490 may have a structure in which, as illustrated in FIGS. 12A and 12B, the conductor 416a and the conductor 416b are not provided and the conductor 426a and the conductor 426b are in contact with the semiconductor 406b. In this case, the low-resistance region 423a (low-resistance region 423b) is preferably provided in a region in contact with at least the conductor 426a and the conductor 426b in the semiconductor 406b and/or the semiconductor 406a. The low-resistance region 423a and the low-resistance region 423b may be formed in such a manner that, for example, the conductor 404 and the like are used as masks and impurities are added to the semiconductor 406b and/or the semiconductor 406a. The conductor 426a and the conductor 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased; thus, the adverse effect of the contact resistance can be decreased. In other words, the on-state current of the transistor 490 can be increased.

Figure 13A:
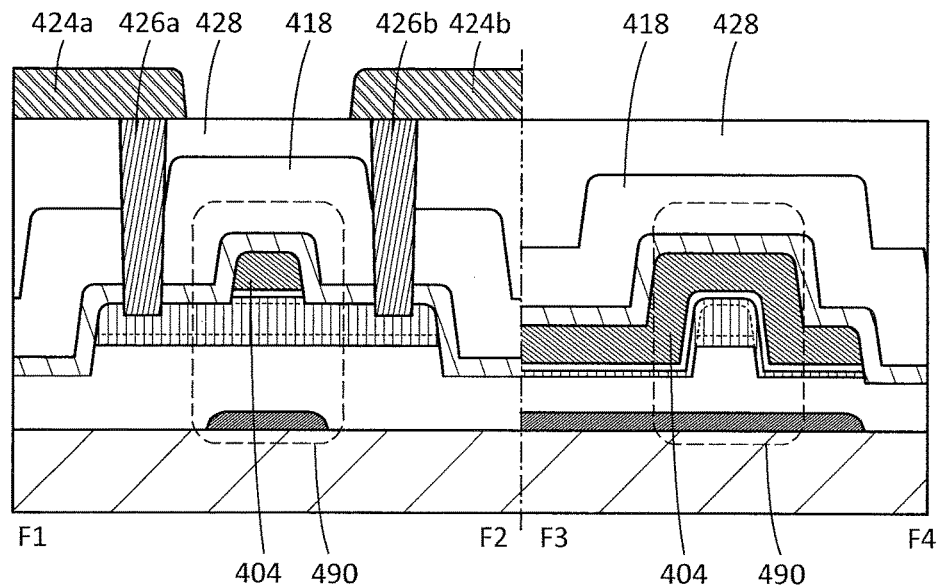
FIGS. 13A and 13B are cross-sectional views illustrating transistors of embodiments of the present invention.

Alternatively, as in FIG. 13A, the transistor 490 does not necessarily include the low resistance region 423a and the low resistance region 423b, for example. In the transistor 490 without including the low resistance region 423a and the low resistance region 423b, the on-state current might be decreased but the short-channel effect can be reduced. In FIG. 13A, a region of the semiconductor 406b between the conductor 404 and the conductor 426a (the conductor 426b) is referred to as an Loff region. For example, the length of each of the Loff regions is set to 50 nm or less, 20 nm or less, or 10 nm or less, in which case the on-state current of the transistor 490 hardly decreases in some cases even when the transistor 490 does not include the low resistance region 423a and the low resistance region 423b.

Figure 13B:
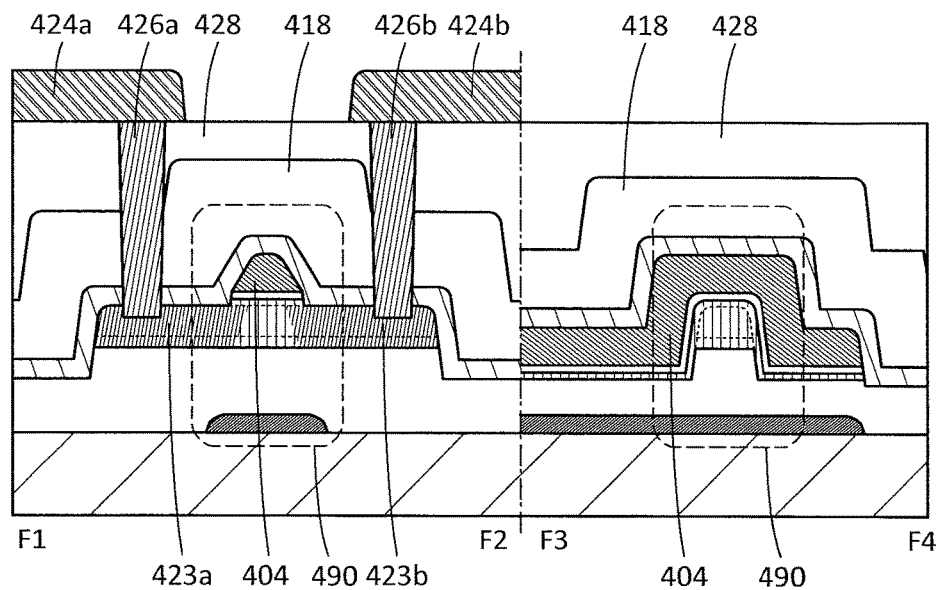

Alternatively, the conductor 404 of the transistor 490 may have a taper angle as illustrated in FIG. 13B, for example. In that case, for example, the low resistance region 423a and the low resistance region 423b have slopes in the depth direction in some cases.

Figure 14A:
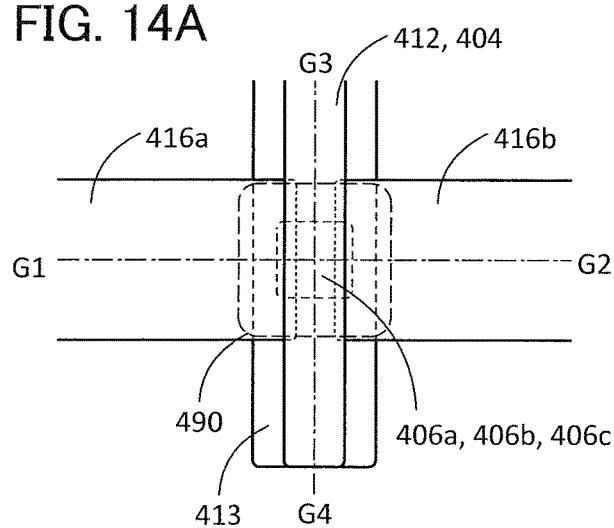
FIGS. 14A and 14B are a top view and a cross-sectional view which illustrate a transistor of one embodiment of the present invention.
Figure 14B:
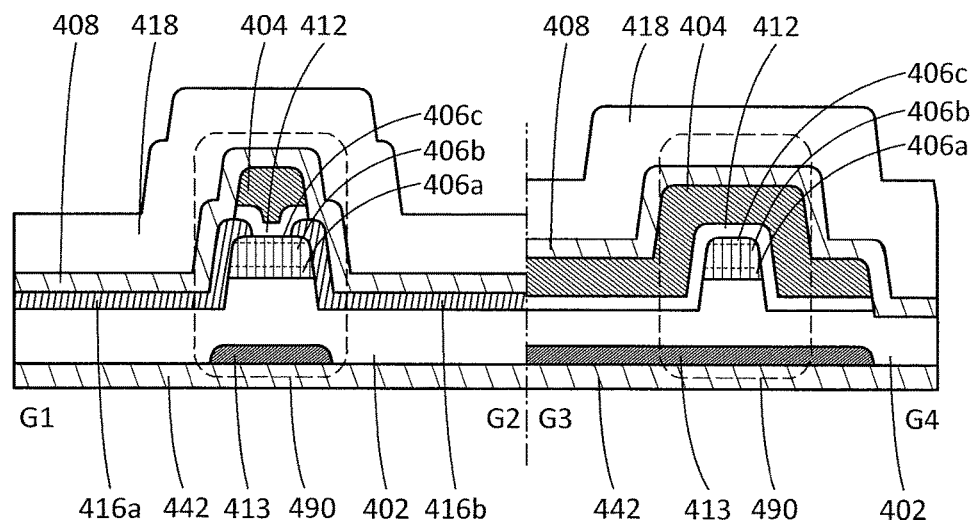

FIGS. 14A and 14B are a top view and a cross-sectional view of the transistor 490. FIG. 14A is the top view and FIG. 14B is the cross-sectional view taken along dashed-dotted line G1-G2 and dashed-dotted line G3-G4 in FIG. 14A. Note that for simplification of the drawing, some components are not illustrated in the top view of FIG. 14A.

The transistor 490 in FIGS. 14A and 14B includes the conductor 413 over the insulator 442; the insulator 402 having a projection over the insulator 442 and the conductor 413; the semiconductor 406a over the projection of the insulator 402; the semiconductor 406b over the semiconductor 406a; the semiconductor 406c over the semiconductor 406b; the conductor 416a and the conductor 416b which are in contact with the semiconductor 406a, the semiconductor 406b, and the semiconductor 406c and which are arranged to be separated from each other; the insulator 412 over the semiconductor 406c, the conductor 416a, and the conductor 416b; the conductor 404 over the insulator 412; the insulator 408 over the conductor 416a, the conductor 416b, the insulator 412, and the conductor 404; and the insulator 418 over the insulator 408.

The insulator 412 is in contact with at least side surfaces of the semiconductor 406b in the cross section taken along line G3-G4. The conductor 404 is in contact with at least a top surface and the side surfaces of the semiconductor 406b with the insulator 412 provided therebetween in the cross section taken along line G3-G4. The conductor 413 faces a bottom surface of the semiconductor 406b through the insulator 402 provided therebetween. The insulator 402 does not necessarily include a projection. Furthermore, the semiconductor 406c, the insulator 408, or the insulator 418 is not necessarily provided.

The structure of the transistor 490 illustrated in FIGS. 14A and 14B is partly different from that of the transistor 490 in FIG. 1. Specifically, the structures of the semiconductors 406a to 406c of the transistor 490 illustrated in FIG. 1 are different from the structures of the semiconductors 406a to 406c of the transistor 490 in FIGS. 14A and 14B. Thus, for the transistor in FIGS. 14A and 14B, the description of the transistor in FIG. 1 can be referred to as appropriate.

Although FIGS. 14A and 14B show an example where the conductor 404 which is a first gate electrode of the transistor 490 is not electrically connected to the conductor 413 which is a second gate electrode, a transistor structure of one embodiment of the present invention is not limited thereto. For example, the conductor 404 may be in contact with the conductor 413. With such a structure, the conductor 404 and the conductor 413 are supplied with the same potential; thus, switching characteristics of the transistor 490 can be improved. Alternatively, the conductor 413 is not necessarily provided.

Figure 15A:
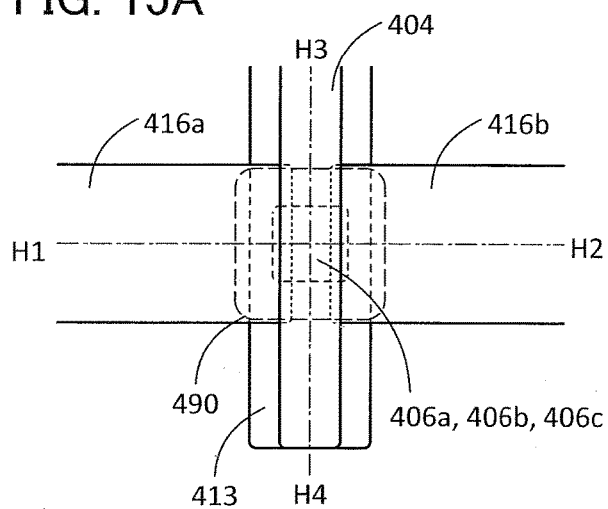
FIGS. 15A and 15B are a top view and a cross-sectional view which illustrate a transistor of one embodiment of the present invention.
Figure 15B:
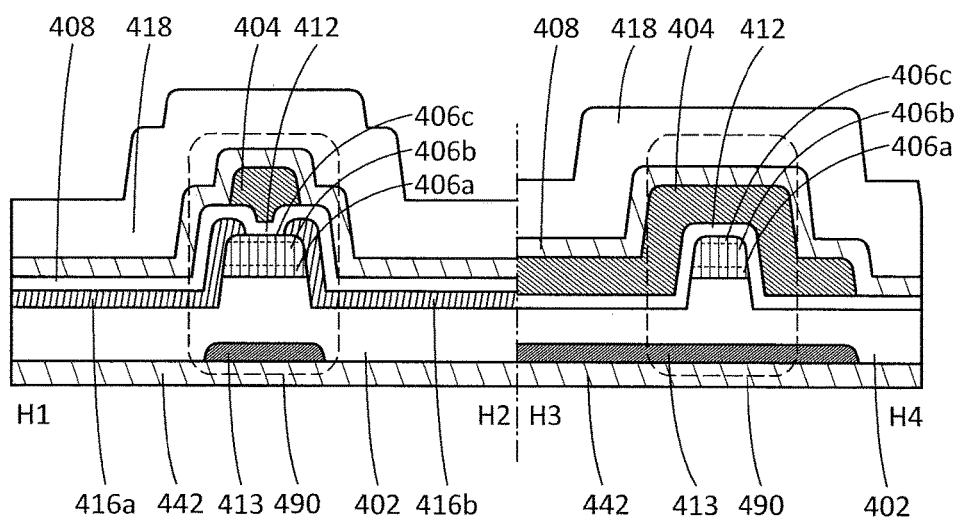

FIG. 15A is another example of the top view of the transistor 490. FIG. 15B is an example of a cross-sectional view taken along dashed-dotted line H1-H2 and dashed-dotted line H3-H4 in FIG. 15A. Note that some components such as an insulator are omitted in FIG. 15A for easy understanding.

Although an example where the insulator 412 and the conductor 404 have similar shapes in the top view in FIG. 14A is shown, a transistor structure of one embodiment of the present invention is not limited thereto. For example, as illustrated in FIGS. 15A and 15B, the insulator 412 may be provided over the insulator 402, the semiconductor 406c, the conductor 416a, and the conductor 416b.

<Method for Manufacturing Semiconductor Device>

Next, a method for manufacturing the transistor 490 illustrated in FIGS. 11A and 11B is described.

First, the insulator 442 is formed. The insulator 442 may be formed by a sputtering method, a chemical vapor deposition (CVD) method, a molecular beam epitaxy (MBE) method, a pulsed laser deposition (PLD) method, an atomic layer deposition (ALD) method, or the like.

The insulator 442 is preferably formed by a DC sputtering method using a metal target or an alloy target. In particular, when a DC sputtering method using oxygen as a reactive gas is used, reaction on the target surface is not enough; thus, an insulator containing a suboxide can be formed in some cases. The suboxide may be stabilized by trapping hydrogen, oxygen, or the like. In the case where the insulator 442 contains a suboxide, an insulator having a high capability of blocking hydrogen or oxygen is obtained.

The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas.

By using the PECVD method, a high-quality film can be formed at a relatively low temperature. By using the TCVD method, in which plasma is not used, a film can be formed with few defects because damage caused by plasma does not occur.

When the CVD method is used, the composition of a film to be formed can be controlled with a flow rate ratio of the source gases. For example, by the MCVD method and the MOCVD method, a film with a certain composition can be formed depending on a flow rate ratio of the source gases. Moreover, with the MCVD method and the MOCVD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is not needed. Thus, the transistors 490 can be manufactured with improved productivity.

Next, a conductor to be the conductor 413 is formed. The conductor to be the conductor 413 may be formed by a sputtering method, a CVD method, an MBE method, a PLD method, an ALD method, or the like.

Next, part of the conductor to be the conductor 413 is etched, so that the conductor 413 is formed.

Figure 16A:
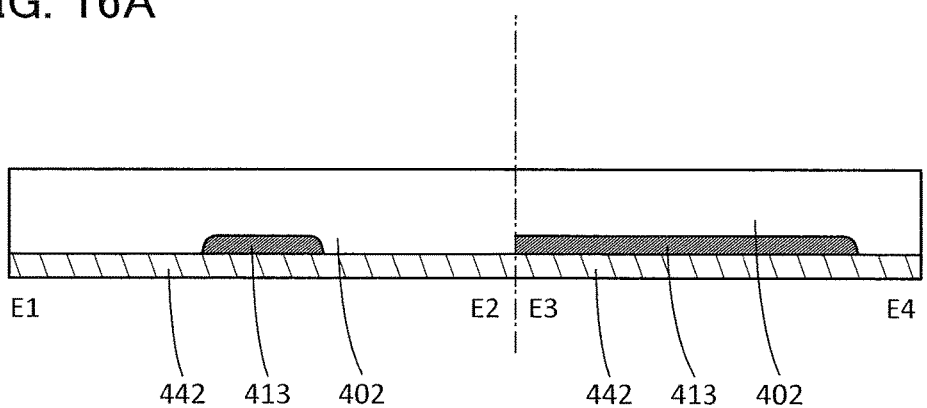
FIGS. 16A and 16B are cross-sectional views illustrating a method for manufacturing a transistor of one embodiment of the present invention.

Next, the insulator 402 is formed (see FIG. 16A). The insulator 402 may be formed by a sputtering method, a CVD method, an MBE method, a PLD method, an ALD method, or the like. Note that here, the case where the top surface of the insulator 402 is planarized by a CMP method or the like is described. By planarizing the top surface of the insulator 402, the subsequent steps can be performed easily, and the yield of the transistor 490 can be increased. For example, by a CMP method, the RMS roughness of the insulator 402 is less than or equal to 1 nm, preferably less than or equal to 0.5 nm, more preferably less than or equal to 0.3 nm. Ra with the measurement area of 1 μm×1 μm is less than 1 nm, preferably less than 0.6 nm, more preferably less than 0.5 nm, still more preferably less than 0.4 nm. P–V with the measurement area of 1 μm×1 μm is less than 10 nm, preferably less than 9 nm, more preferably less than 8 nm, still more preferably less than 7 nm. The transistor 490 of one embodiment of the present invention is not limited to a transistor when the top surface of the insulator 402 is planarized.

The insulator 402 may be formed to contain excess oxygen. Alternatively, oxygen may be added after the insulator 402 is formed. The addition of oxygen may be performed by an ion implantation method at an acceleration voltage of higher than or equal to 2 kV and lower than or equal to 100 kV and at a dose of greater than or equal to $5 \times 10^{14}$ ions/cm² and less than or equal to $5 \times 10^{16}$ ions/cm², for example.

Note that in the case where the insulator 402 is a stacked-layer film, films in the stacked-layer film may be formed using by different formation methods such as the above formation methods. For example, the first film may be formed by a CVD method and the second film may be formed by an ALD method. Alternatively, the first film may be formed by a sputtering method and the second film may be formed by an ALD method. When films are formed by different formation methods as described above, the films can have different functions or different properties. Furthermore, by stacking the films, a more appropriate film can be formed as a stacked-layer film.

In other words, an n-th film (n is a natural number) is formed by at least one of a sputtering method, a CVD method, an MBE method, a PLD method, an ALD method, and the like, and an n+1-th film is formed by at least one of a sputtering method, a CVD method, an MBE method, a PLD method, an ALD method, and the like. Note that the n-th film and the n+1-th film may be formed by the same formation method or different formation methods. Note that the n-th film and the n+2-th film may be formed by the same formation method. Alternatively, all the films may be formed by the same formation method.

Next, a semiconductor 436a to be the semiconductor 406a and a semiconductor 436b to be the semiconductor 406b are formed in this order. The semiconductor to be the semiconductor 406a and the semiconductor to be the semiconductor 406b may be formed by a sputtering method, a CVD method, an MBE method, a PLD method, an ALD method, or the like.

In the case where In—Ga—Zn oxide layers are formed as the semiconductor 436a and the semiconductor 436b by an MOCVD method, trimethylindium, trimethylgallium, dimethylzinc, and the like may be used as the source gases. The source gas is not limited to the combination of these gases, triethylindium or the like may be used instead of trimethylindium. Triethylgallium or the like may be used instead of trimethylgallium. Diethylzinc or the like may be used instead of dimethylzinc.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the first heat treatment, crystallinity of the semiconductor 436a and crystallinity of the semiconductor 436b can be increased and impurities such as hydrogen and water can be removed.

Figure 16B:
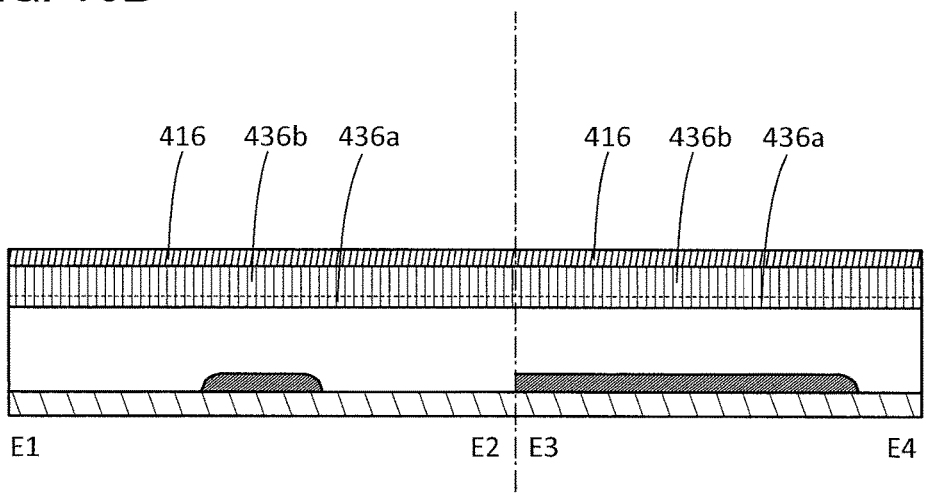

Next, a conductor 416 is formed (see FIG. 16B). The conductor 416 may be formed by a sputtering method, a CVD method, an MBE method, a PLD method, an ALD method, or the like.

The conductor 416a and the conductor 416b are formed in such a manner that the conductor 416 is formed and then partly etched. Therefore, it is preferable to employ a formation method by which the semiconductor 406b is not damaged when the conductor 416 is formed. In other words, the conductor 416 is preferably formed by an MCVD method or the like.

Note that in the case where the conductor 416 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. When films are formed by different formation methods as described above, the films can have different functions or different properties. Furthermore, by stacking the films, a more appropriate film can be formed as a stacked-layer film.

In other words, in the case where the conductor 416 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor 416 or at least one of the films in the stacked-layer film of the conductor 416 and the semiconductor to be the semiconductor 406a or the semiconductor to be the semiconductor 406b may be formed by the same formation method. For example, both of them may be formed by an ALD method. Thus, they can be formed without exposure to the air. As a result, entry of impurities can be prevented.

Note that the conductor 416 or at least one of the films in the stacked-layer film of the conductor 416, the semiconductor to be the semiconductor 406a or the semiconductor to be the semiconductor 406b, and the insulator 402 or at least one of the films in the stacked-layer film of the insulator 402 may be formed by the same formation method. For example, all of them may be formed by a sputtering method. Thus, they can be formed without exposure to the air. As a result, entry of impurities can be prevented. Note that a method for manufacturing a semiconductor device of one embodiment of the present invention is not limited thereto.

Figure 17A:
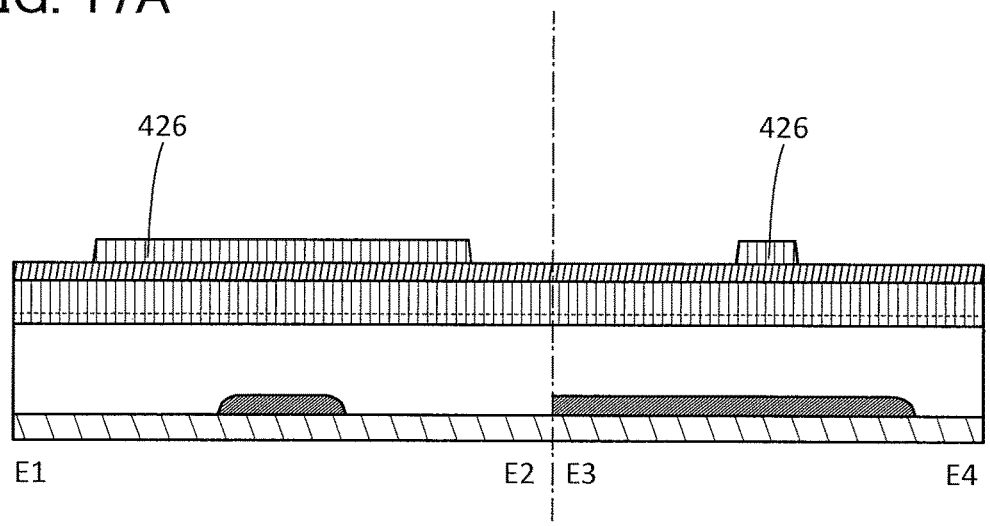
FIGS. 17A and 17B are cross-sectional views illustrating a method for manufacturing the transistor of one embodiment of the present invention.

Next, a mask 426 is formed (see FIG. 17A). For the mask 426, a photoresist may be used. Note that for the mask 426, a bottom anti-reflective coating (BARC) film may be provided as a base of a photoresist. When the bottom anti-reflective coating film is provided, defects due to halation can be suppressed and a minute defect can be obtained.

Next, the conductor 416 is etched using the mask 426, whereby a conductor 417 is formed. To form the conductor 417 having a minute shape, the mask 426 having a minute shape needs to be formed. When the mask 426 having a minute shape is too thick, the mask might fall down; therefore, the mask 426 preferably includes a region with a thickness small enough to be self-standing. The conductor 416 to be etched using the mask 426 preferably has a thickness small enough to be etched under conditions that the mask 426 can withstand. Since the conductor 416 becomes the conductor 416a and the conductor 416b serving as a source electrode and a drain electrode of the transistor 490, the conductor 416 preferably has a certain thickness such that the on-state current of the transistor 490 is high. Accordingly, the conductor 416 includes a region with a thickness of, for example, greater than or equal to 5 nm and less than or equal to 30 nm, preferably greater than or equal to 5 nm and less than or equal to 20 nm, more preferably greater than or equal to 5 nm and less than or equal to 15 nm.

Figure 17B:
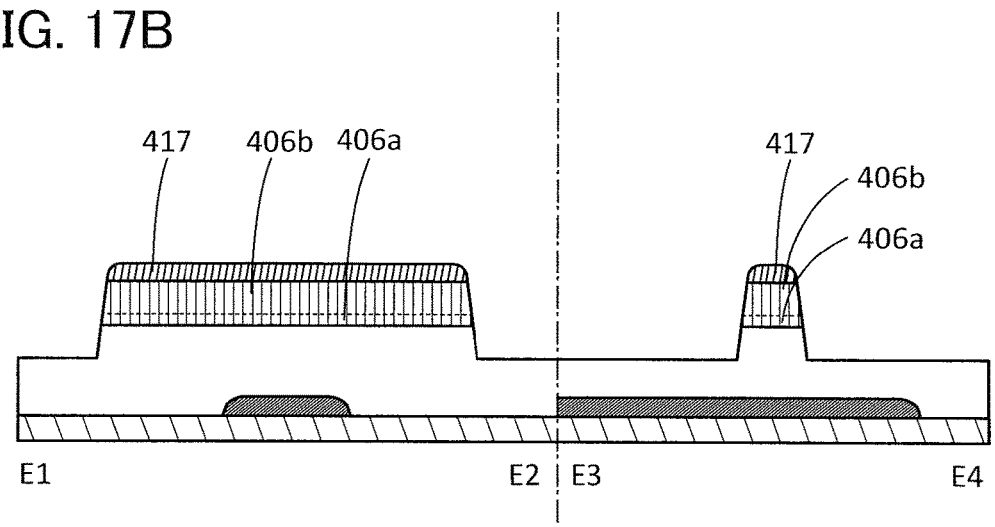

Next, the semiconductor 436a and the semiconductor 436b are etched using the conductor 417 as a mask, so that the semiconductor 406a and the semiconductor 406b are formed. At this time, when the insulator 402 is etched, an s-channel structure is likely to be formed (see FIG. 17B).

Next, part of the conductor 417 is etched, so that the conductor 416a and the conductor 416b are formed (see FIG. 18A). As described above, the conductor 416 formed as a mask for etching the semiconductor 436a and the semiconductor 436b becomes the conductor 416a and the conductor 416b serving as the source electrode and the drain electrode of the transistor 490. Since the conductor 416 to be the conductor 416a and the conductor 416b is also used as a mask, the number of steps for manufacturing the transistor 490 can be reduced. The transistor 490 has a structure suitable for a miniaturized semiconductor device because the area occupied by the conductor 416a and the conductor 416b can be small.

Next, a semiconductor to be the semiconductor 406c is formed. The semiconductor to be the semiconductor 406c can be formed by a sputtering method, a CVD method, an MBE method, a PLD method, an ALD method, or the like.

In the case where an In—Ga—Zn oxide layer is formed as the semiconductor to be the semiconductor 406c by an MOCVD method, trimethylindium, trimethylgallium, dimethylzinc, or the like may be used as the source gases. The source gas is not limited to the above combination of these gases, triethylindium or the like may be used instead of trimethylindium. Triethylgallium or the like may be used instead of trimethylgallium. Diethylzinc or the like may be used instead of dimethylzinc.

Next, second heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a is selected. In other words, as the semiconductor 406a, a semiconductor having a function of passing oxygen is selected. As the semiconductor to be the semiconductor 406c, a semiconductor having a function of blocking oxygen is selected. In this case, by the second heat treatment, excess oxygen in the insulator 402 is moved to the semiconductor 406b through the semiconductor 406a. The semiconductor 406b is covered with the semiconductor to be the semiconductor 406c; thus, outward diffusion of excess oxygen is less likely to occur. Therefore, by performing the second heat treatment at this time, defects (oxygen vacancies) in the semiconductor 406b can be efficiently reduced. Note that the second heat treatment may be performed at a temperature such that excess oxygen (oxygen) in the insulator 402 is diffused to the semiconductor 406b. For example, the description of the first heat treatment may be referred to for the second heat treatment. The second heat treatment is preferably performed at a temperature lower than that of the first heat treatment by higher than or equal to 20° C. and lower than or equal to 150° C., preferably higher than or equal to 40°

C. and lower than or equal to 100° C. because excess oxygen (oxygen) is not released from the insulator 402 too much.

Next, an insulator to be the insulator 412 is formed. The insulator to be the insulator 412 may be formed by a sputtering method, a CVD method, an MBE method, a PLD method, an ALD method, or the like.

Note that in the case where the insulator to be the insulator 412 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the insulator to be the insulator 412 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+1-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Next, third heat treatment may be performed. For example, as the semiconductor 406a, a semiconductor whose oxygen-transmitting property is higher than that of the semiconductor to be the semiconductor 406c is selected. That is, as the semiconductor to be the semiconductor 406c, a semiconductor whose oxygen-transmitting property is lower than that of the semiconductor 406a. As the semiconductor to be the semiconductor 406c, a semiconductor having a function of blocking oxygen is selected. For example, as the semiconductor 406a, a semiconductor whose oxygen-transmitting property is higher than that of the insulator to be the insulator 412 is selected. That is, as the insulator to be the insulator 412, a semiconductor whose oxygen-transmitting property is lower than that of the semiconductor 406a is selected. In other words, as the semiconductor 406a, a semiconductor having a function of passing oxygen is selected. As the insulator to be the insulator 412, an insulator having a function of blocking oxygen is selected. In this case, by the third heat treatment, excess oxygen in the insulator 402 is moved to the semiconductor 406b through the semiconductor 406a. The semiconductor 406b is covered with the semiconductor to be the semiconductor 406c and the insulator to be the insulator 412; thus, outward diffusion of excess oxygen is less likely to occur. Therefore, by performing the third heat treatment at this time, defects (oxygen vacancies) in the semiconductor 406b can be efficiently reduced. Note that the third heat treatment may be performed at a temperature such that excess oxygen (oxygen) in the insulator 402 is diffused to the semiconductor 406b. For example, the description of the first heat treatment may be referred to for the third heat treatment. The third heat treatment is preferably performed at a temperature lower than that of the first heat treatment by higher than or equal to 20° C. and lower than or equal to 150° C., preferably higher than or equal to 40° C. and lower than or equal to 100° C. because excess oxygen (oxygen) is not released from the insulator 402 too much. Note that in the case where the insulator to be the insulator 412 has a function of blocking oxygen, the semiconductor to be the semiconductor 406c does not necessarily have a function of blocking oxygen.

Next, a conductor to be the conductor 404 is formed. The conductor to be the conductor 404 may be formed by a sputtering method, a CVD method, an MBE method, a PLD method, an ALD method, or the like.

The insulator to be the insulator 412 functions as a gate insulator of the transistor 490. Therefore, the conductor to be the conductor 404 is preferably formed by a formation method by which the insulator to be the insulator 412 is not damaged when the conductor to be the conductor 404 is formed. In other words, the conductor is preferably formed by an MCVD method or the like.

Note that in the case where the conductor to be the conductor 404 is formed to have a stacked-layer structure, films in the stacked-layer film may be formed by different formation methods such as a sputtering method, a CVD method (a plasma CVD method, a thermal CVD method, an MCVD method, an MOCVD method, or the like), an MBE method, a PLD method, and an ALD method. For example, the first film may be formed by an MOCVD method and the second film may be formed by a sputtering method. Alternatively, the first film may be formed by an ALD method and the second film may be formed by an MOCVD method. Alternatively, the first film may be formed by an ALD method and the second film may be formed by a sputtering method. Alternatively, the first film may be formed by an ALD method, the second film may be formed by a sputtering method, and the third film may be formed by an ALD method. Thus, when films are formed by different formation methods, the films can have different functions or different properties. Furthermore, by stacking the films, a more appropriate film can be formed as a stacked-layer film.

In other words, in the case where the conductor to be the conductor 404 is a stacked-layer film, for example, an n-th film (n is a natural number) is formed by at least one of a sputtering method, a CVD method (a plasma CVD method, a thermal CVD method, an MCVD method, an MOCVD method, or the like), an MBE method, a PLD method, an ALD method, and the like and an n+l-th film is formed by at least one of a sputtering method, a CVD method (a plasma CVD method, a thermal CVD method, an MCVD method, an MOCVD method, or the like), an MBE method, a PLD method, an ALD method, and the like. Note that the n-th film and the n+1-th film may be formed by different formation methods. Note that the n-th film and the n+2-th film may be formed by the same formation method. Alternatively, all the films may be formed by the same formation method.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, both of them may be formed by an ALD method. Thus, they can be formed without exposure to the air. As a result, entry of impurities can be prevented. For example, the conductor to be the conductor 404 and the insulator to be the insulator 412 which are in contact with each other may be formed by the same formation method. Thus, the formation can be performed in the same chamber. As a result, entry of impurities can be prevented.

Note that the conductor to be the conductor 404 or at least one of the films in the stacked-layer film of the conductor to be the conductor 404 and the insulator to be the insulator 412 or at least one of the films in the stacked-layer film of the insulator to be the insulator 412 may be formed by the same formation method. For example, all of them may be formed by a sputtering method. Thus, they can be formed without exposure to the air. As a result, entry of impurities can be prevented.

Next, the conductor to be the conductor 404 is partly etched, so that the conductor 404 is formed. The conductor 404 is formed to overlap with at least part of the semiconductor 406b.

Next, in a manner similar to that of the conductor to be the conductor 404, the insulator to be the insulator 412 is partly etched, so that the insulator 412 is formed.

Next, in a manner similar to those of the conductor to be the conductor 404 and the insulator to be the insulator 412, the semiconductor to be the semiconductor 406c is partly etched, so that the semiconductor 406c is formed.

Figure 2:
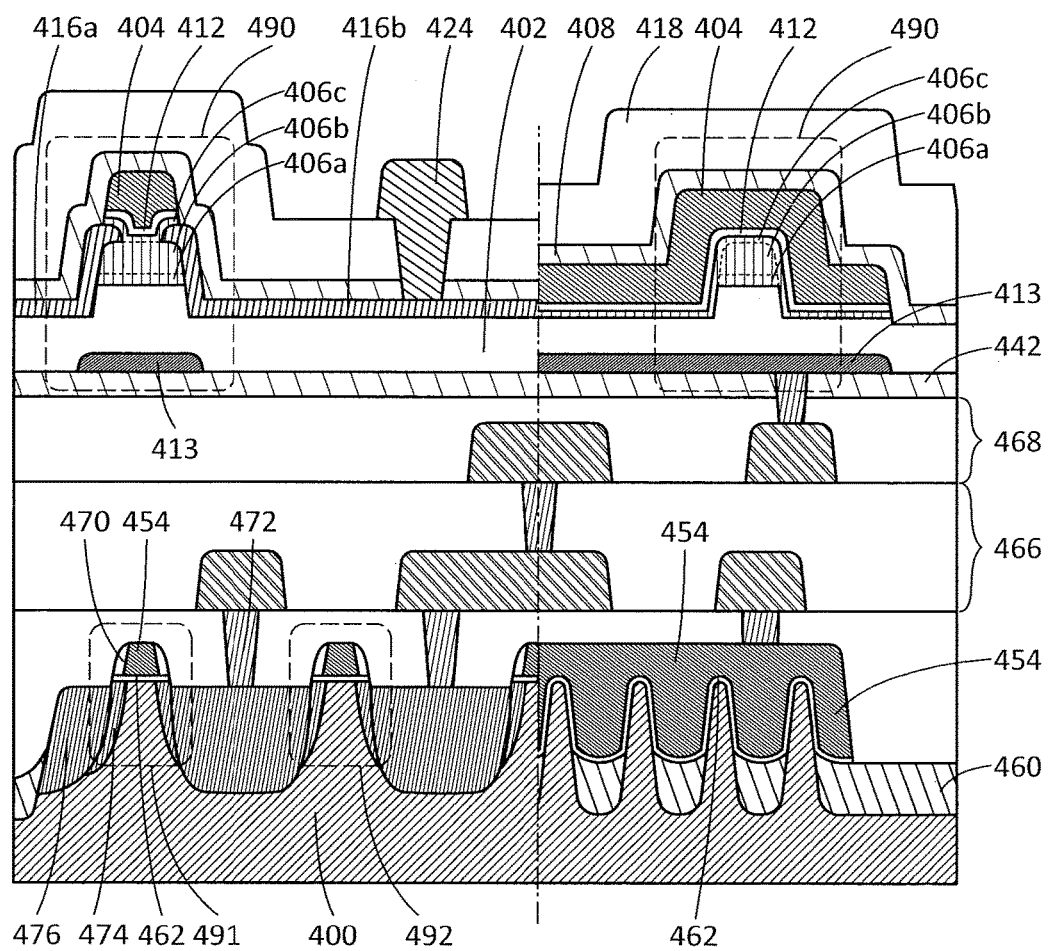
FIG. 2 is a cross-sectional view illustrating a semiconductor device of one embodiment of the present invention.

The conductor to be the conductor 404, the insulator to be the insulator 412, and the semiconductor to be the semiconductor 406c may be partly etched through the same photolithography process, for example. Alternatively, the insulator to be the insulator 412 and the semiconductor to be the semiconductor 406c may be etched using the conductor 404 as a mask. Thus, the conductor 404, the insulator 412, and the semiconductor 406c have similar shapes in the top view. The insulator 412 and/or the semiconductor 406c may project as compared with the conductor 404 as illustrated in FIG. 18C1 or the conductor 404 may project as compared with the insulator 412 and/or the semiconductor 406c as illustrated in FIG. 18C2. With such a shape, shape defects are reduced and gate leakage current can be reduced in some cases.

Next, the insulator 408 is formed (see FIG. 18B). The insulator 408 may be formed by a sputtering method, a CVD method, an MBE method, a PLD method, an ALD method, or the like.

Next, fourth heat treatment may be performed. For example, as the semiconductor 406a, a semiconductor whose oxygen-transmitting property is higher than that of the semiconductor 406c is selected. In other words, as the semiconductor 406c, a semiconductor whose oxygen-transmitting property is lower than that of the semiconductor 406a is selected. As the semiconductor 406c, a semiconductor having a function of blocking oxygen is selected. For example, as the semiconductor 406a, a semiconductor whose oxygen-transmitting property is higher than that of the insulator 412 is selected. In other words, as the insulator 412, a semiconductor whose oxygen-transmitting property is lower than that of the semiconductor 406a is selected. For example, as the semiconductor 406a, a semiconductor whose oxygen-transmitting property is higher than that of the insulator 408 is selected. That is, as the insulator 408, a semiconductor whose oxygen-transmitting property is lower than that of the semiconductor 406a is selected. In other words, as the semiconductor 406a, a semiconductor having a function of passing oxygen is selected. As the insulator 408, an insulator having a function of blocking oxygen is selected. In this case, by the fourth heat treatment, excess oxygen in the insulator 402 is moved to the semiconductor 406b through the semiconductor 406a. The semiconductor 406b is covered with any of the semiconductor 406c, the insulator 412, and the insulator 408; thus, outward diffusion of excess oxygen is less likely to occur. Therefore, by performing the fourth heat treatment at this time, defects (oxygen vacancies) in the semiconductor 406b can be efficiently reduced. Note that the fourth heat treatment may be performed at a temperature such that excess oxygen (oxygen) in the insulator 402 is diffused to the semiconductor 406b. For example, the description of the first heat treatment may be referred to for the fourth heat treatment. The fourth heat treatment is preferably performed at a temperature lower than that of the first heat treatment by higher than or equal to 20° C. and lower than or equal to 150° C., preferably higher than or equal to 40° C. and lower than or equal to 100° C. because excess oxygen (oxygen) is not released from the insulator 402 too much. Note that in the case where the insulator 408 has a function of blocking oxygen, the semiconductor 406c and/or the insulator 412 does not necessarily have a function of blocking oxygen.

One or more of the first heat treatment, the second heat treatment, the third heat treatment, and the fourth heat treatment are not necessarily performed.

Next, the insulator 418 is formed. The insulator 418 may be formed by a sputtering method, a CVD method, an MBE method, a PLD method, an ALD method, or the like.

Through the above steps, the transistor 490 illustrated in FIGS. 11A and 11B can be manufactured.

<Structure Example of Transistor>

Figure 19A:
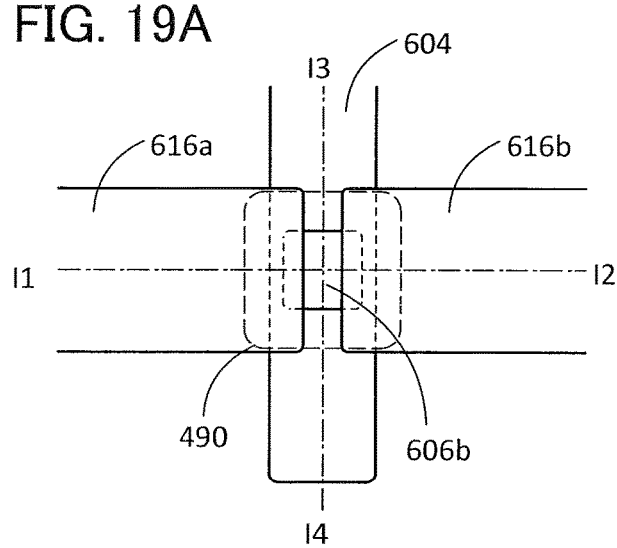
FIGS. 19A and 19B are a top view and a cross-sectional view which illustrate a transistor of one embodiment of the present invention.
Figure 19B:
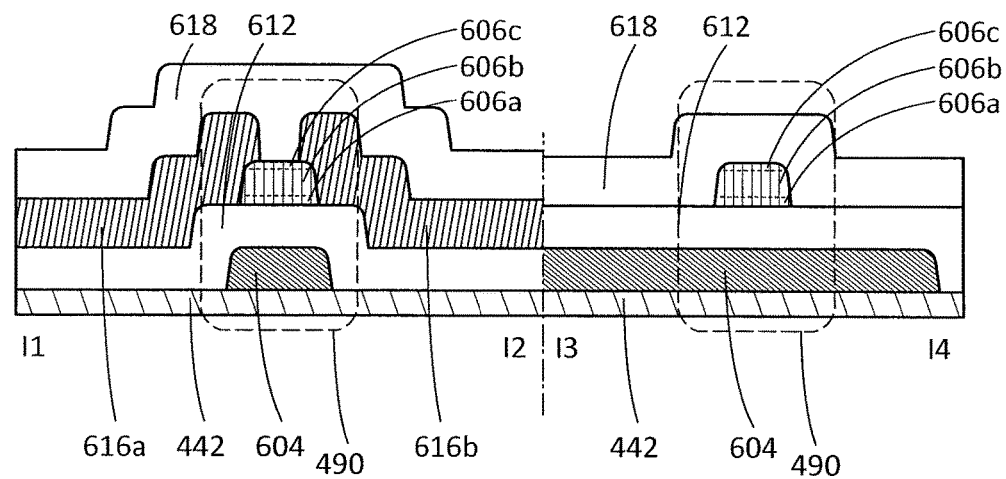

FIGS. 19A and 19B are a top view and a cross-sectional view which illustrate the transistor 490 of one embodiment of the present invention. FIG. 19A is the top view and FIG. 19B is the cross-sectional view taken along dashed-dotted line 11-12 and dashed-dotted line 13-14 in FIG. 19A. Note that for simplification of the drawing, some components are not illustrated in the top view in FIG. 19A.

The transistor 490 in FIGS. 19A and 19B includes a conductor 604 over the insulator 442, an insulator 612 over the conductor 604, a semiconductor 606a over the insulator 612, a semiconductor 606b over the semiconductor 606a, a semiconductor 606c over the semiconductor 606b, a conductor 616a and a conductor 616b which are in contact with the semiconductor 606a, the semiconductor 606b, and the semiconductor 606c and which are arranged to be separated from each other, and an insulator 618 over the semiconductor 606c, the conductor 616a, and the conductor 616b. The conductor 604 faces a bottom surface of the semiconductor 606b with the insulator 612 provided therebetween. The insulator 612 may have a projection. The semiconductor 606a or the insulator 618 is not necessarily provided.

The semiconductor 606b serves as a channel formation region of the transistor 490. The conductor 604 serves as a first gate electrode (also referred to as a front gate electrode) of the transistor 490. The conductor 616a and the conductor 616b serve as a source electrode and a drain electrode of the transistor 490.

The insulator 618 is preferably an insulator containing excess oxygen.

For the conductor 604, the description of the conductor 404 is referred to. For the insulator 612, the description of the insulator 412 is referred to. For the semiconductor 606a, the description of the semiconductor 406c is referred to. For the semiconductor 606b, the description of the semiconductor 406b is referred to. For the semiconductor 606c, the description of the semiconductor 406a is referred to. For the conductor 616a and the conductor 616b, the description of the conductor 416a and the conductor 416b is referred to. For the insulator 618, the description of the insulator 402 is referred to.

Thus, the transistor 490 in FIGS. 19A and 19B can be regarded to be different from the transistor 490 in FIGS. 15A and 15B in only part of the structure in some cases. Specifically, the structure of the transistor 490 in FIGS. 19A and 19B is similar to the structure of the transistor 490 in FIGS. 15A and 15B in which the conductor 404 is not provided. Thus, for the transistor 490 in FIGS. 19A and 19B, the description of the transistor 490 in FIGS. 15A and 15B can be referred to as appropriate.

The transistor 490 may include a conductor which overlaps with the semiconductor 606b with the insulator 618 provided therebetween. The conductor functions as a second gate electrode of the transistor 490. For the conductor, the description of the conductor 413 is referred to. Furthermore, an s-channel structure may be formed using the second gate electrode.

Over the insulator 618, a display element may be provided. For example, a pixel electrode, a liquid crystal layer, a common electrode, a light-emitting layer, an organic EL layer, an anode electrode, a cathode electrode, or the like may be provided. The display element is connected to the conductor 616a or the like, for example.

Figure 20A:
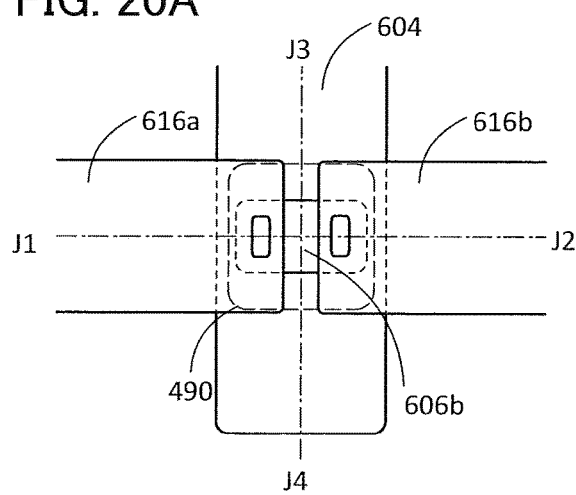
FIGS. 20A and 20B are a top view and a cross-sectional view which illustrate a transistor of one embodiment of the present invention.
Figure 20B:
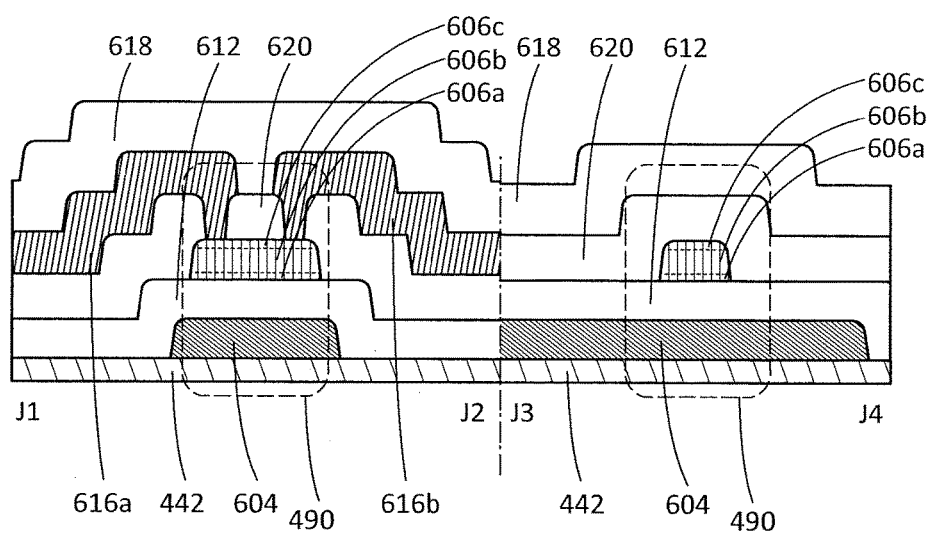

Over the semiconductor, an insulator that can function as a channel protective film may be provided. Alternatively, as illustrated in FIGS. 20A and 20B, an insulator 620 may be provided between the semiconductor 606c and the conductors 616a and 616b. In that case, the conductor 616a (conductor 616b) and the semiconductor 606c are connected to each other through an opening in the insulator 620. For the insulator 620, the description of the insulator 618 may be referred to.

Figure 21A:
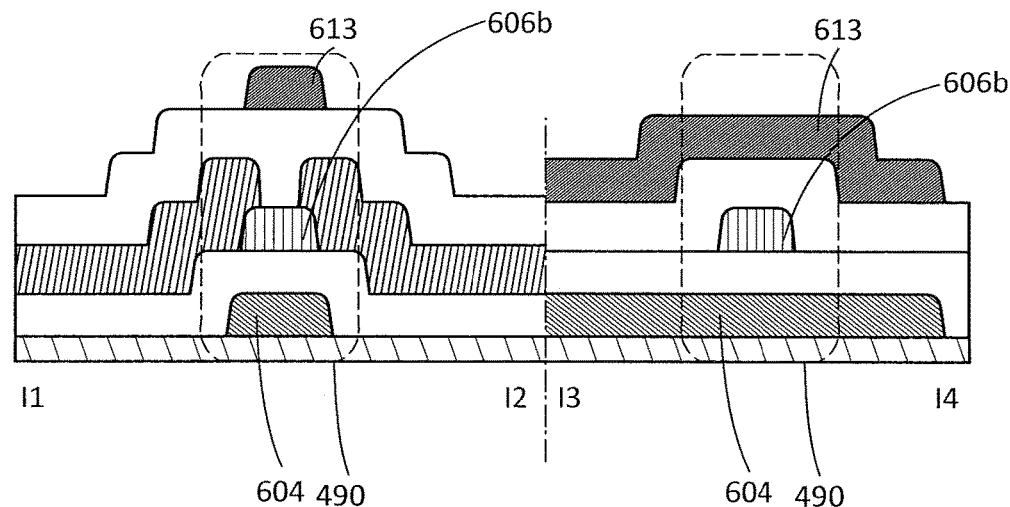
FIGS. 21A and 21B are cross-sectional views illustrating transistors of embodiments of the present invention.
Figure 21B:
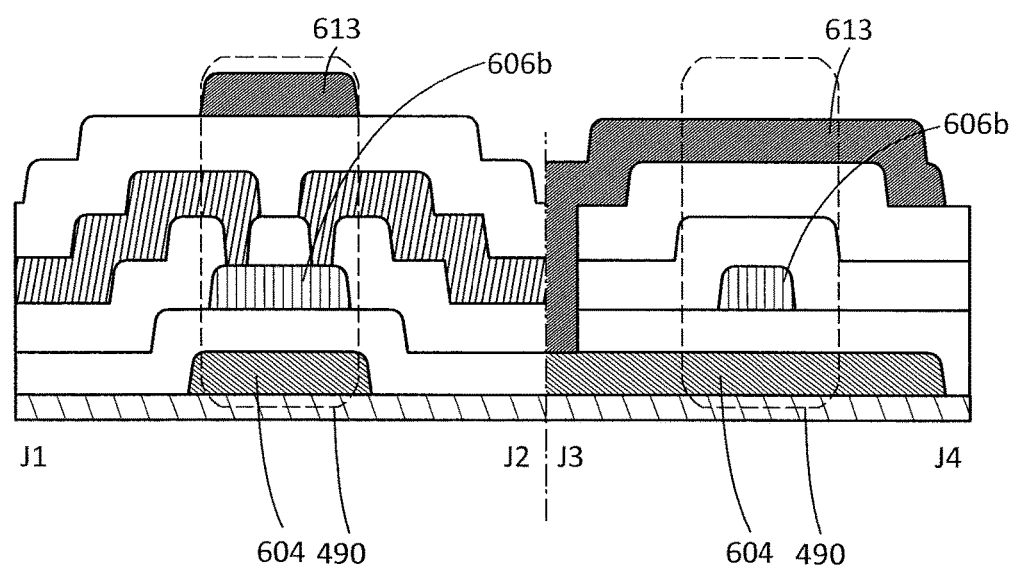

In FIG. 19B and FIG. 20B, a conductor 613 may be provided over the insulator 618. Examples in that case are shown in FIGS. 21A and 21B. For the conductor 613, the description of the conductor 413 is referred to. A potential or signal which is the same as that supplied to the conductor 604 or a potential or signal which is different from that supplied to the conductor 604 may be supplied to the conductor 613. For example, by supplying a constant potential to the conductor 613, the threshold voltage of the transistor 490 may be controlled. In other words, the conductor 613 can function as a second gate electrode.

<Semiconductor Device>

An example of a semiconductor device of one embodiment of the present invention is shown below.

Figure 22A:
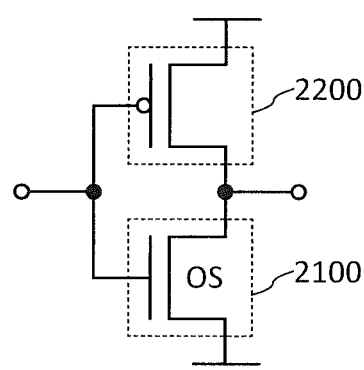
FIGS. 22A and 22B are each a circuit diagram of a semiconductor device of one embodiment of the present invention.

A circuit diagram in FIG. 22A shows a configuration of a so-called CMOS inverter in which the p-channel transistor 2200 and the n-channel transistor 2100 are connected to each other in series and in which gates of them are connected to each other.

Figure 22B:
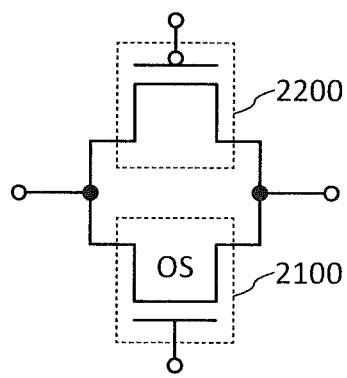

A circuit diagram in FIG. 22B shows a configuration in which sources of the transistors 2100 and 2200 are connected to each other and drains of the transistors 2100 and 2200 are connected to each other. With such a configuration, the transistors can function as a so-called CMOS analog switch.

For example, as the transistor 2100, the transistor 490 or the like may be used. For example, as the transistor 2200, the transistor 491 or the like may be used. An example of a semiconductor device (memory device) which can retain stored data even when not powered and which has an unlimited number of write cycles is shown in FIGS. 23A and 23B.

Figure 23A:
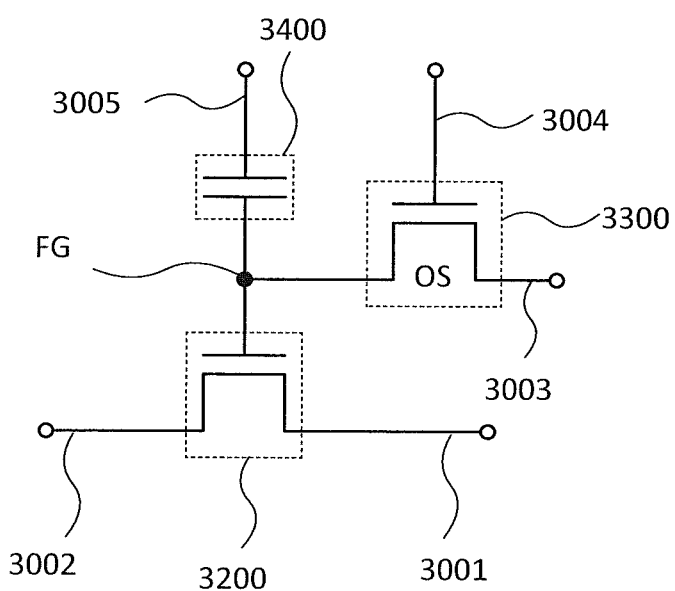
FIGS. 23A and 23B are each a circuit diagram of a memory device of one embodiment of the present invention.
Figure 23B:
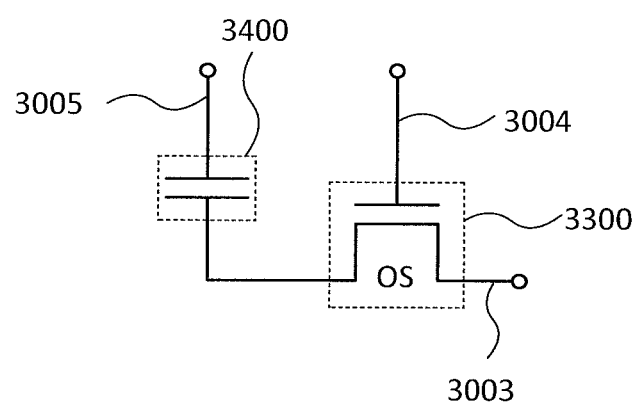

The semiconductor device illustrated in FIG. 23A includes a transistor 3200 using a first semiconductor, a transistor 3300 using a second semiconductor, and a capacitor 3400. Note that the transistor 490 or the like may be used as the transistor 3300. As the transistor 3200, the transistor 491 or the like may be used.

In the case where the transistor 3300 is a transistor using an oxide semiconductor, since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 23A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 23A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 23B is different form the semiconductor device in FIG. 23A in that the transistor 3200 is not provided. Also in this case, writing and retaining operation of data can be performed in a manner similar to that of the semiconductor device in FIG. 23A.

Reading of data in the semiconductor device in FIG. 23B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 24.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 24. FIG. 24 is a block diagram illustrating a configuration example of an RF tag.

Figure 24:
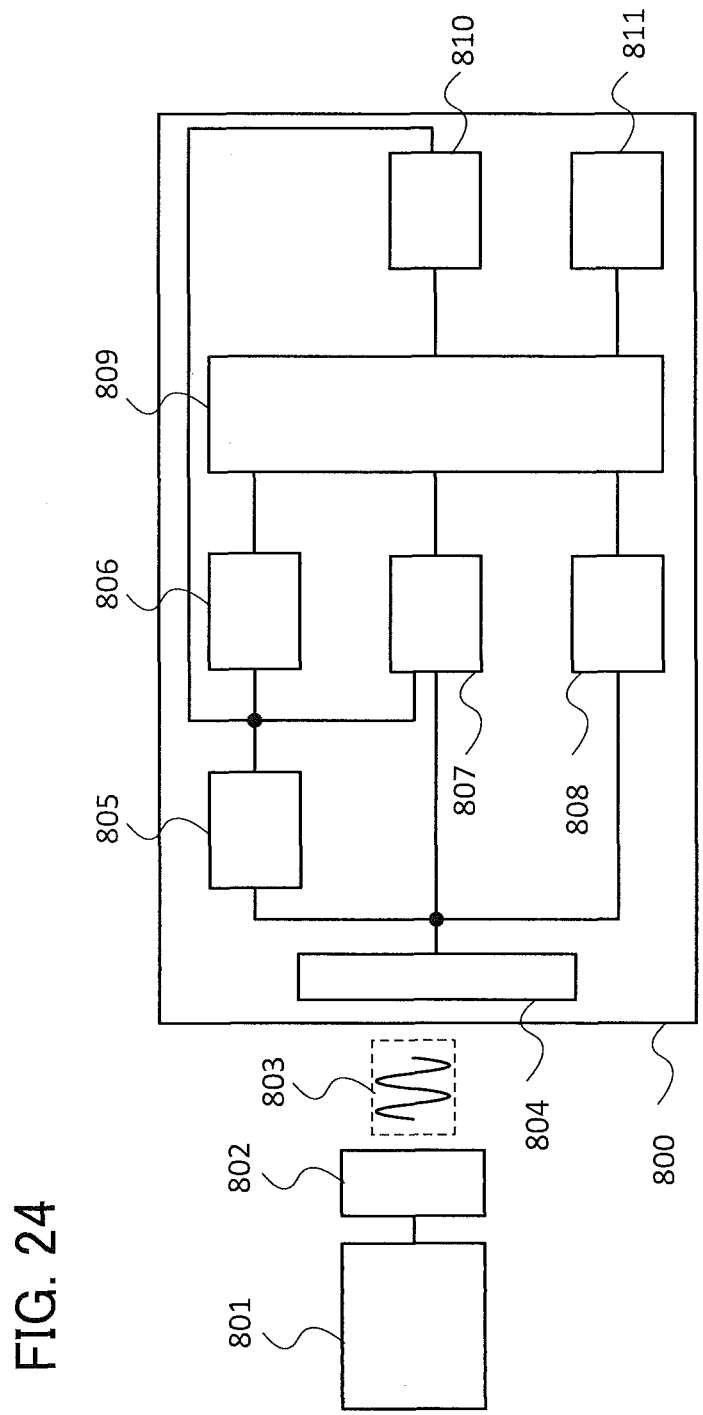
FIG. 24 is a block diagram of an RF tag of one embodiment of the present invention.
Figure 25A:
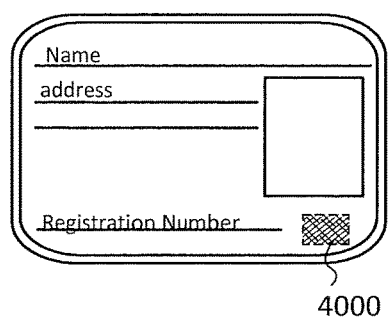
FIGS. 25A to 25F illustrate application examples of an RF tag of one embodiment of the present invention.
Figure 25B:
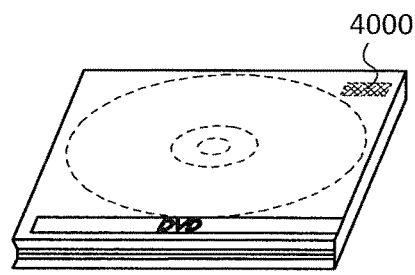
Figure 25C:
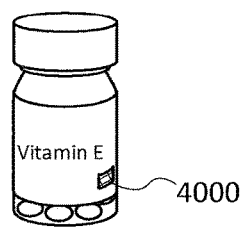
Figure 25D:
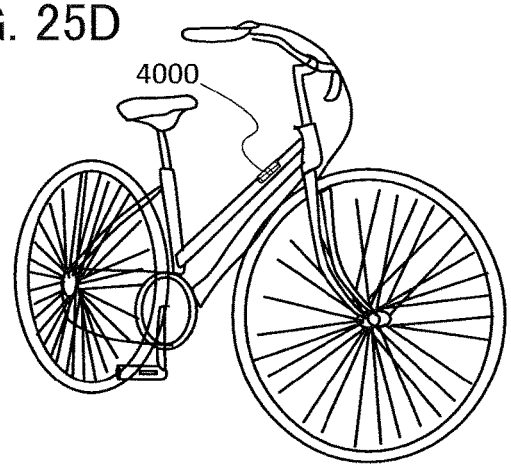
Figure 25E:
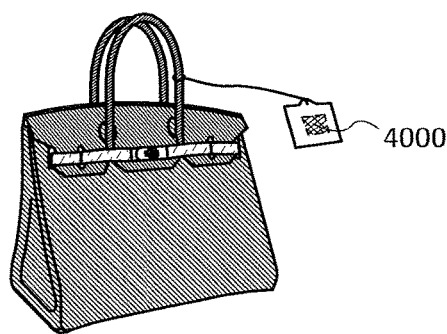
Figure 25F:
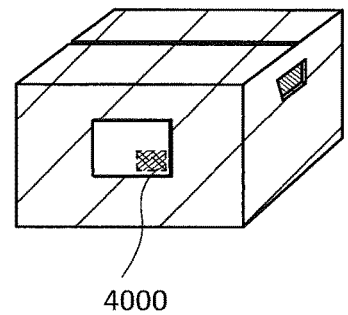

As shown in FIG. 24, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 25A to 25F. The RF tag is widely used and can be provided for, for example, products such as bills, coins, securities, bearer bonds, documents (e.g., driver's licenses or resident's cards, see FIG. 25A), packaging containers (e.g., wrapping paper or bottles, see FIG. 25C), recording media (e.g., DVDs or video tapes, see FIG. 25B), vehicles (e.g., bicycles, see FIG. 25D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 25E and 25F).

An RF tag 4000 of one embodiment of the present invention is fixed on products by, for example, being attached to a surface thereof or being embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 26:
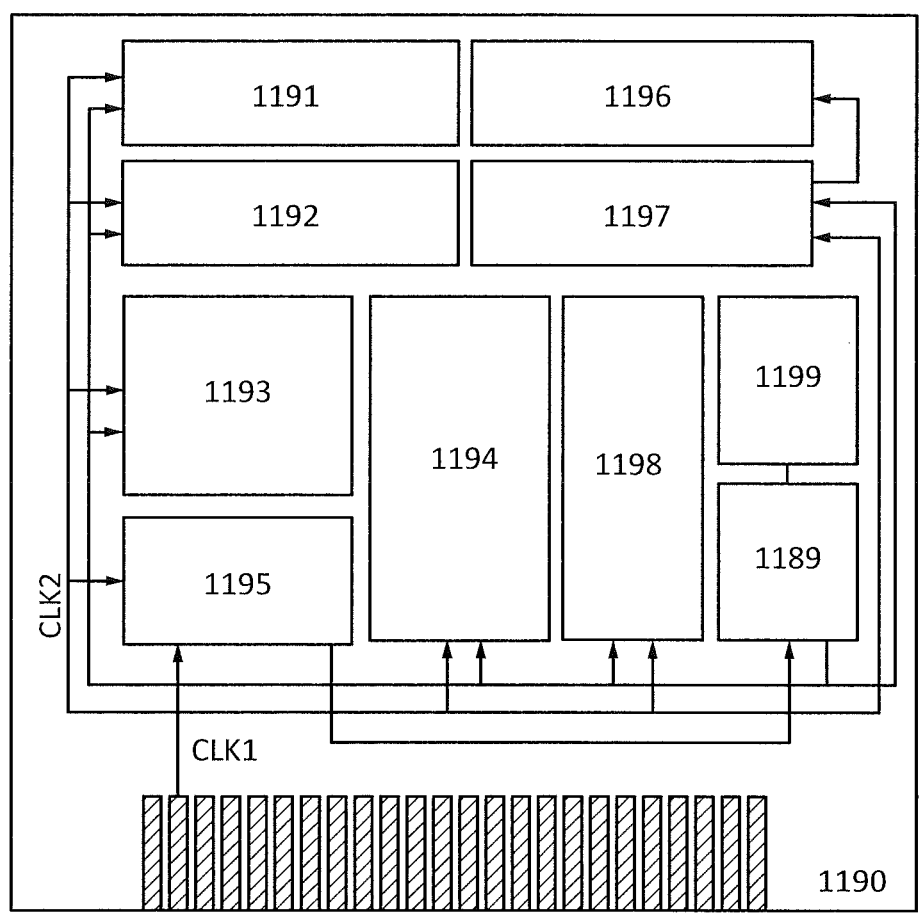
FIG. 26 is a block diagram illustrating a CPU of one embodiment of the present invention.

FIG. 26 is a block diagram illustrating a configuration example of a CPU including any of the above-described transistors as a component.

The CPU illustrated in FIG. 26 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 26 is just an example in which the configuration has been simplified, and an actual CPU may have a variety of configurations depending on the application. For example, the CPU may have the following configuration: a structure including the CPU illustrated in FIG. 26 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 26, a memory cell is provided in the register 1196. For the memory cell of the register 1196, any of the above-described transistors, the above-described memory device, or the like can be used.

In the CPU illustrated in FIG. 26, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 27:
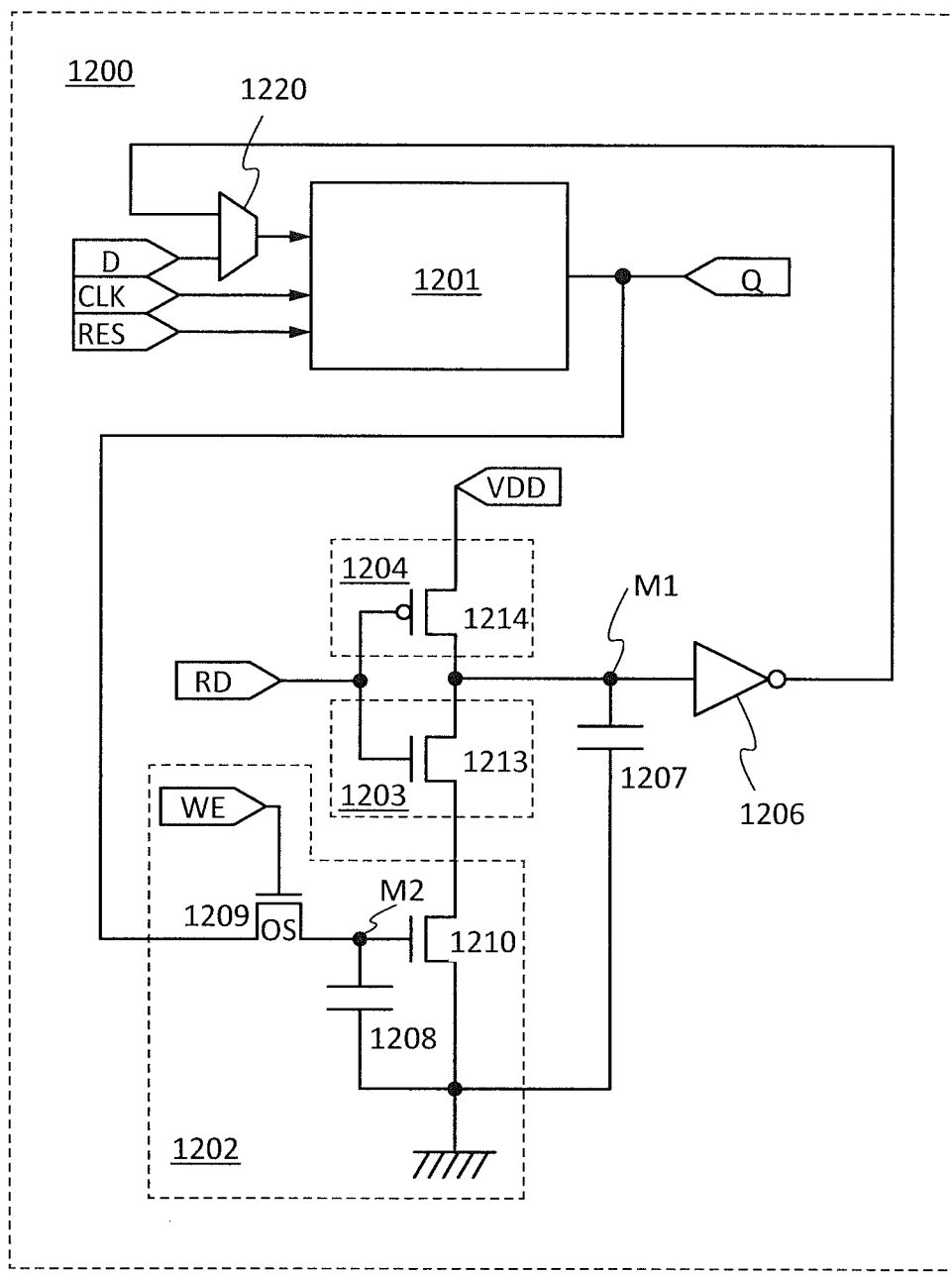
FIG. 27 is a circuit diagram of a memory element of one embodiment of the present invention.

FIG. 27 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 27 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 27, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 27, among the transistors used in the memory element 1200, the transistor 490 or the like may be used as the transistor 1209, for example. As the transistors other than the transistor 1209, the transistor 491, the transistor 492, or the like may be used, for example.

As the circuit 1201 in FIG. 27, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

[Configuration Example]

Figure 28A:
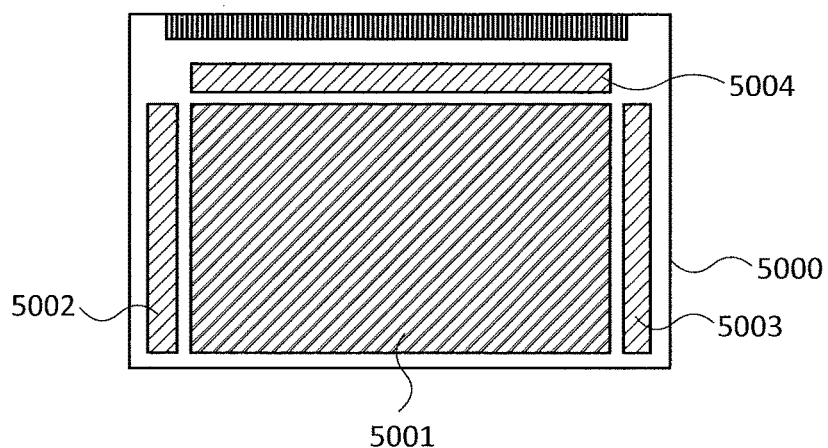
FIGS. 28A to 28C are a top view and circuit diagrams of a display device of one embodiment of the present invention.
Figure 28B:
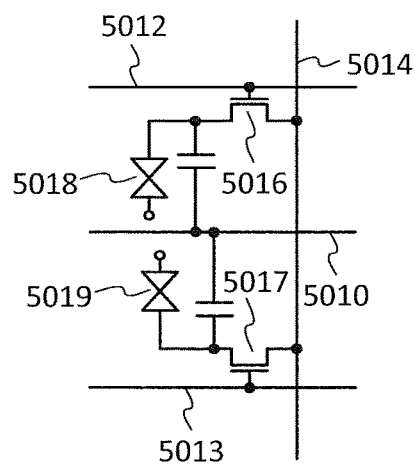
Figure 28C:
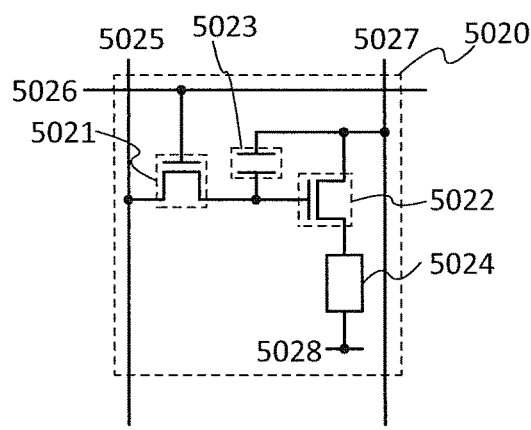

FIG. 28A is a top view of a display device of one embodiment of the present invention. FIG. 28B illustrates a pixel circuit where a liquid crystal element is used for a pixel of a display device of one embodiment of the present invention. FIG. 28C illustrates a pixel circuit where an organic EL element is used for a pixel of a display device of one embodiment of the present invention.

The transistor 490 or the like can be used as a transistor used for the pixel. Here, an example in which an n-channel transistor is used is shown. Note that a transistor manufactured through the same steps as the transistor used for the pixel may be used for a driver circuit. Thus, by using the above-described transistor for a pixel or a driver circuit, the display device can have high display quality and/or high reliability.

FIG. 28A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Furthermore, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 28B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

The shapes of a first pixel electrode electrically connected to the transistor 5016 and a second pixel electrode electrically connected to the transistor 5017 are described. The first pixel electrode and the second pixel electrode are separated by a slit. The first pixel electrode has a V shape and the second pixel electrode is provided so as to surround the first pixel electrode.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 28B. For example, a switch, a resistor, a capacitor, a transistor, a sensor, a logic circuit, or the like may be added to the pixel circuit shown in FIG. 28B.

[Organic EL Display Device]

FIG. 28C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 28C illustrates an example of a pixel circuit. Here, one pixel includes two n-channel transistors. Note that the transistor 490 or the like can be used as the n-channel transistor. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, the transistor 490 or the like can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 28C. For example, a switch, a resistor, a capacitor, a sensor, a transistor, a logic circuit, or the like may be added to the pixel circuit shown in FIG. 28C.

In the case where the transistor 490 or the like is used for the circuit shown in FIGS. 28A to 28C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

A color layer (also referred to as a color filter) may be used in order to obtain a full-color display device in which white light (W) for a backlight (e.g., an organic EL element, an inorganic EL element, an LED, or a fluorescent lamp) is used. As the color layer, red (R), green (G), blue (B), yellow (Y), or the like may be combined as appropriate, for example. With the use of the color layer, higher color reproducibility can be obtained than in the case without the color layer. In this case, by providing a region with the color layer and a region without the color layer, white light in the region without the color layer may be directly utilized for display. By partly providing the region without the color layer, a decrease in luminance due to the color layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the color layer in some cases.

<Module>

A display module using a semiconductor device of one embodiment of the present invention is described below with reference to FIG. 29.

Figure 29:
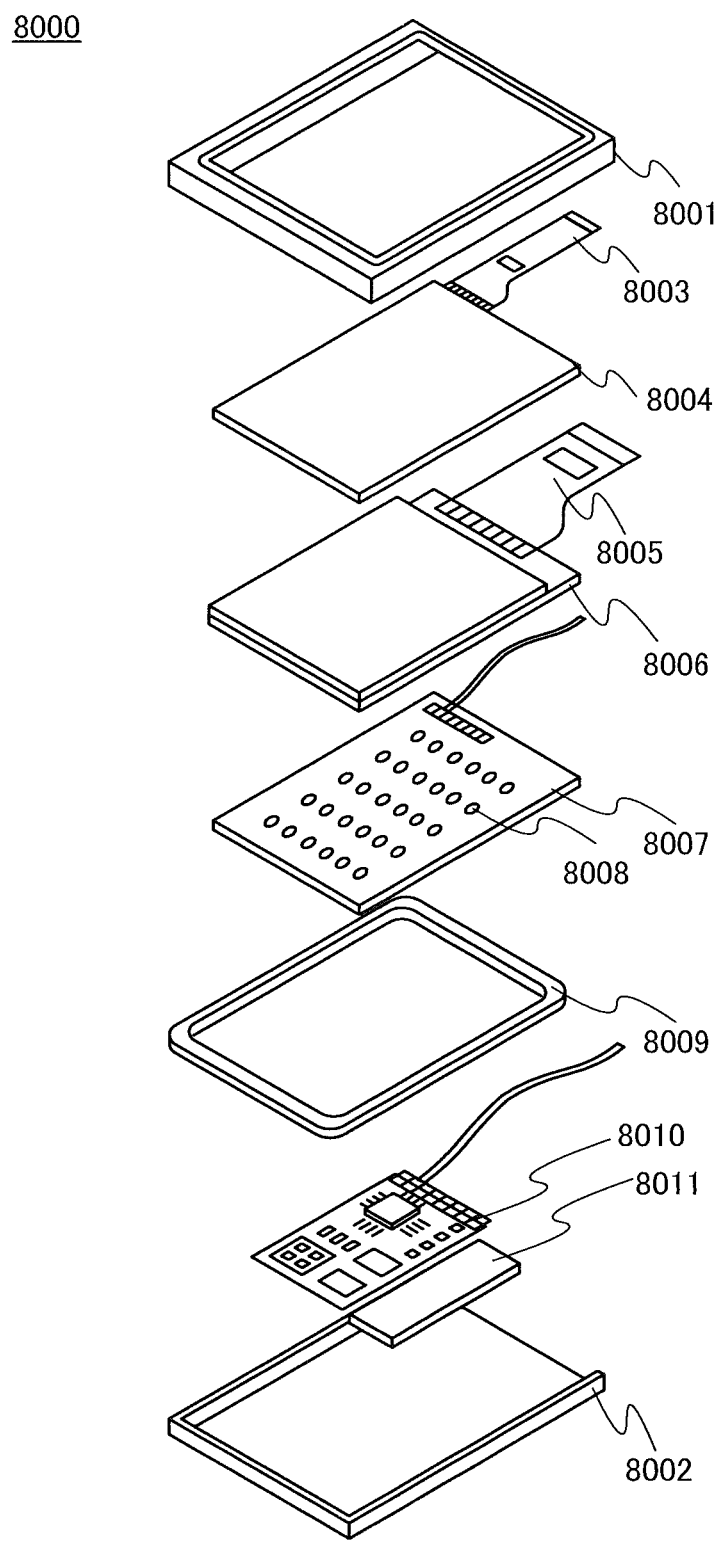
FIG. 29 illustrates a display module of one embodiment of the present invention.

In a display module 8000 in FIG. 29, a touch panel 8004 connected to an FPC 8003, a cell 8006 connected to an FPC 8005, a backlight unit 8007, a frame 8009, a printed board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed board 8010. The frame 8009 may function as a radiator plate.

The printed board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet <Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 30A to 30F illustrate specific examples of these electronic devices.

Figure 30A:
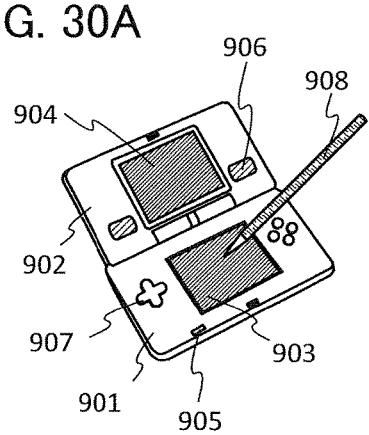
FIGS. 30A to 30F each illustrate an electronic device of one embodiment of the present invention.

FIG. 30A illustrates a portable game console including a housing 901, a housing 902, a display portion 903, a display portion 904, a microphone 905, a speaker 906, an operation key 907, a stylus 908, and the like. Although the portable game console in FIG. 30A has the two display portions 903 and 904, the number of display portions included in a portable game console is not limited to this.

Figure 30B:
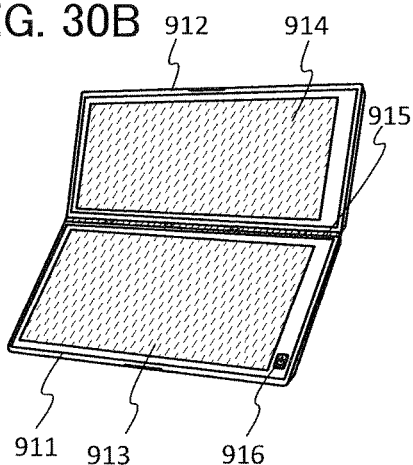

FIG. 30B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 30C:
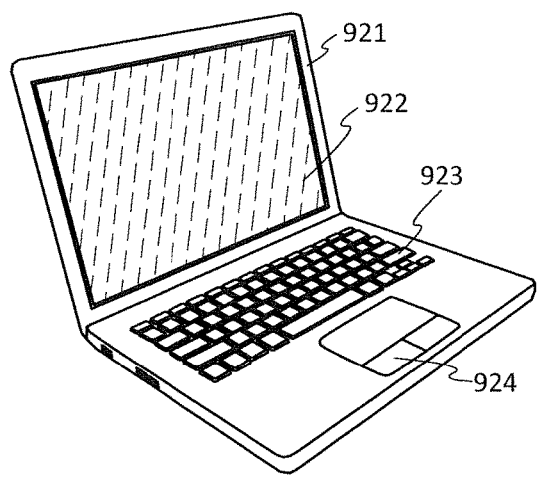

FIG. 30C illustrates a laptop personal computer, which includes a housing 921, a display portion 922, a keyboard 923, a pointing device 924, and the like.

Figure 30D:
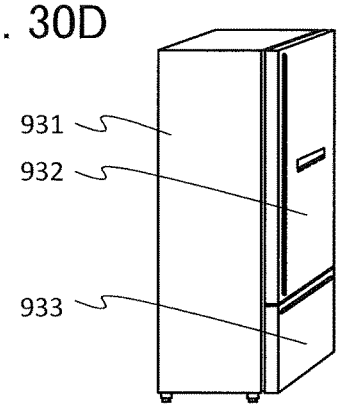

FIG. 30D illustrates the electric refrigerator-freezer including a housing 931, a door for a refrigerator 932, a door for a freezer 933, and the like.

Figure 30E:
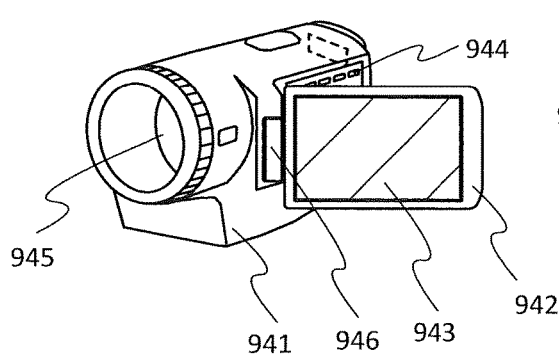

FIG. 30E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 30F:
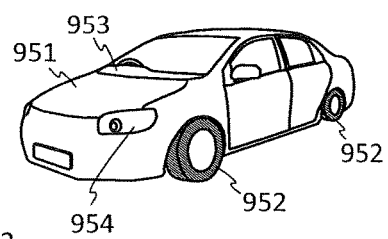

FIG. 30F illustrates an ordinary vehicle including a car body 951, wheels 952, a dashboard 953, lights 954, and the like.

<Electronic Device with Curved Display Region or Curved Light-Emitting Region>

Electronic devices with a curved display region or a curved light-emitting region, which are embodiments of the present invention, are described below with reference to FIGS. 31A1, 31A2, 31A3, 31B1, 31B2, 31C1, and 31C2. Here, information devices, in particular, portable information devices (portable devices) are described as examples of the electronic devices. The portable information devices include, for example, mobile phone devices (e.g., phablets and smartphones) and tablet terminals (slate PCs).

FIG. 31A1 is a perspective view illustrating an external shape of a portable device 1300A. FIG. 31A2 is a top view illustrating the portable device 1300A. FIG. 31A3 illustrates a usage state of the portable device 1300A.

FIGS. 31B1 and 31B2 are perspective views illustrating the outward form of a portable device 1300B.

FIGS. 31C1 and 31C2 are perspective views illustrating the outward form of a portable device 1300C.

<Portable Device>

The portable device 1300A has one or more functions of a telephone, email creating and reading, a notebook, information browsing, and the like.

A display portion of the portable device 1300A is provided along plural surfaces. For example, the display portion may be provided by placing a flexible display device along the inside of a housing. Thus, text data, image data, or the like can be displayed on a first region 1311 and/or a second region 1312.

For example, images used for three operations can be displayed on the first region 1311 (see FIG. 31A1). Furthermore, text data and the like can be displayed on the second region 1312 as indicated by dashed rectangles in the drawing (see FIG. 31A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 31A3). For example, the user can see the phone number, name, and the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, a touch panel may be, for example, a matrix switch type, a resistive type, an ultrasonic surface acoustic wave type, an infrared type, electromagnetic induction type, or an electrostatic capacitance type. In the case where the input device is provided in the display device, an in-cell sensor, an on-cell sensor, or the like may be used.

Note that the portable device 1300A can be provided with a vibration sensor or the like and a memory device that stores a program for shifting a mode into an incoming call rejection mode based on vibration sensed by the vibration sensor or the like. Thus, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion in the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and the housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

EXAMPLE 1

In this example, an insulator having a function of blocking hydrogen and oxygen which can be used for a semiconductor device of one embodiment of the present invention is described.

A method for fabricating samples will be described below.

First, a silicon substrate (also referred to as Si sub) is prepared. Next, a 50-nm-thick silicon nitride (also referred to as $SiN_x$) is formed over the silicon substrate. The silicon nitride is silicon nitride from which hydrogen is released by heat treatment. Here, a sample fabricated in the above manner is referred to as a reference sample.

Figure 38:
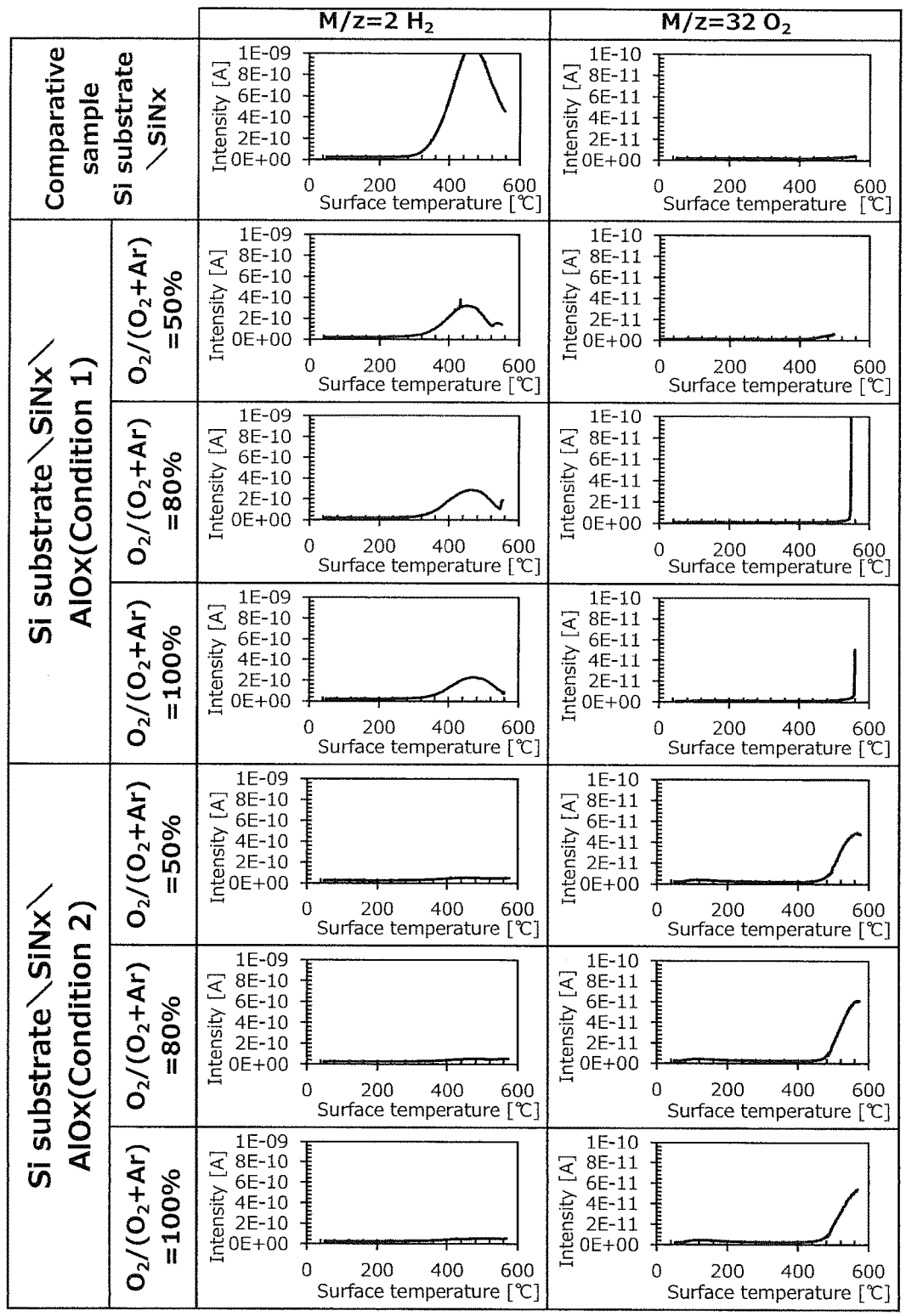
FIG. 38 shows TDS results.

FIG. 38 shows results of TDS in the range of 50° C. to 550° C. The amount of a gas having a mass-to-charge ratio (M/z) of 2 (hydrogen) of the reference sample was $3.5 \times 10^{16}$ molecules/cm$^2$. In the reference sample, a gas having the mass-to-charge ratio of 32 (oxygen) was hardly observed.

Next, a 70-nm-thick aluminum oxide (also referred to as $AlO_x$) was formed over the silicon nitride.

Here, the aluminum oxide film under Condition 1 was formed by a sputtering method using an aluminum oxide target and an RF power source (13.56 MHz). The pressure was 0.4 Pa, the target-substrate distance was 60 mm, and the power density was 3.4 W/cm$^2$.

The aluminum oxide film under Condition 2 was formed by a sputtering method using an aluminum target and a DC power source. The pressure was 0.4 Pa, the target-substrate distance was 60 mm, and the power density was 3.4 W/cm$^2$.

For each of Condition 1 and Condition 2, the percentages of an oxygen gas ($O_2/(O_2+Ar)$) of the film formation gas were 50%, 80%, and 100%.

FIG. 38 and Table 1 show results of TDS in the range of 50° C. to 550° C.

TABLE 1

| | | Release amount [molecule/cm$^2$] | |
|---|---|---|---|
| | | M/z = 2 H$_2$ | M/z = 32 O$_2$ |
| Si sub\SiN$_x$ reference sample | — | 3.5 × 10$^{16}$ | 5.6 × 10$^{13}$ |
| Si sub\SiN$_x$\AlO$_x$ (Condition 1) | O$_2$/(O$_2$ + Ar) = 50% | 1.1 × 10$^{16}$ | 1.6 × 10$^{14}$ |
| | O$_2$/(O$_2$ + Ar) = 80% | 9.4 × 10$^{15}$ | 2.0 × 10$^{14}$ |
| | O$_2$/(O$_2$ + Ar) = 100% | 7.3 × 10$^{15}$ | 1.8 × 10$^{14}$ |
| Si sub\SiN$_x$\AlO$_x$ (Condition 2) | O$_2$/(O$_2$ + Ar) = 50% | 9.9 × 10$^{14}$ | 1.2 × 10$^{15}$ |
| | O$_2$/(O$_2$ + Ar) = 80% | 1.0 × 10$^{15}$ | 1.6 × 10$^{15}$ |
| | O$_2$/(O$_2$ + Ar) = 100% | 1.1 × 10$^{15}$ | 1.3 × 10$^{15}$ |

Under each of the conditions, the amount of released hydrogen of the sample was reduced as compared with the reference sample. That is, aluminum oxide under Condition 1 and Condition 2 has a function of blocking hydrogen. Under Condition 1 and Condition 2, the amount of released hydrogen hardly changes depending on the percentage of an oxygen gas.

On the other hand, when Condition 1 and Condition 2 are compared, the amount of released hydrogen under Condition 2 is smaller than that under Condition 1. When Condition 1 and Condition 2 are compared, the amount of released oxygen under Condition 2 is larger. Accordingly, aluminum oxide under Condition 2 contains more excess oxygen than that under Condition 1.

Next, the reason why the hydrogen blocking property under Condition 2 is higher than that under Condition 1 was examined.

Figure 39A:
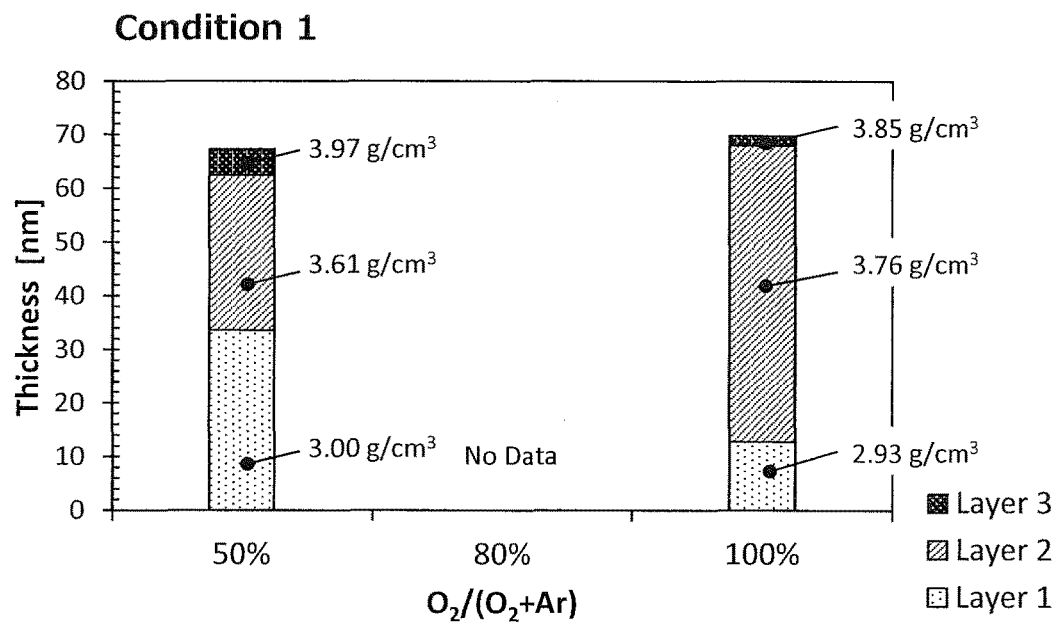
FIGS. 39A and 39B show film density.
Figure 39B:
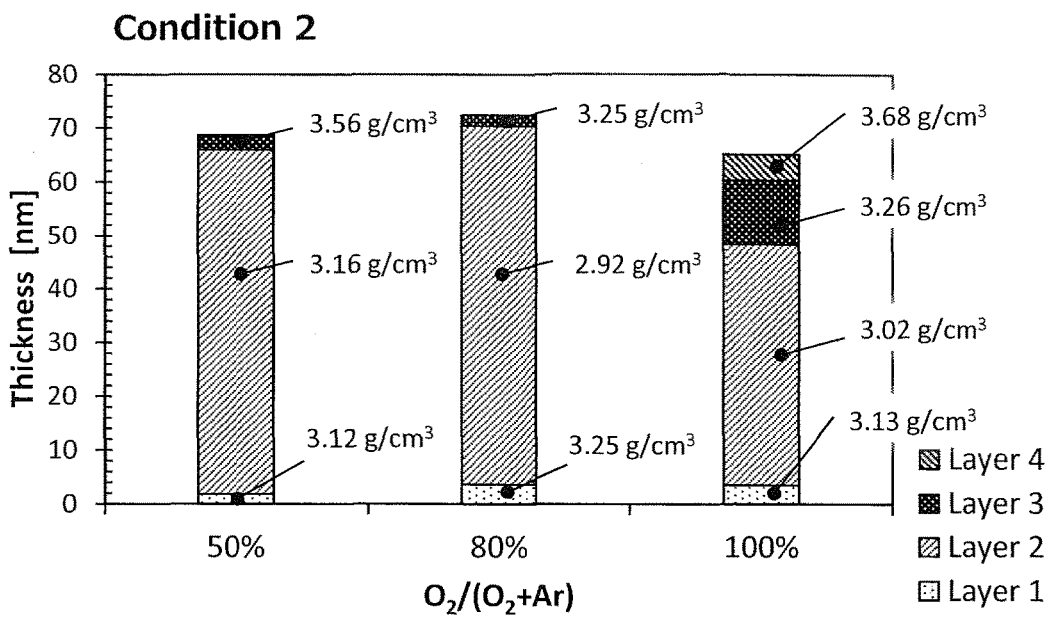

First, the film density was measured by an X-ray reflectivity (XRR) method. FIGS. 39A and 39B show the results. The measurement of the film density by an XRR method was performed on samples each including a silicon substrate, silicon oxide over the silicon substrate, and aluminum oxide over the silicon oxide. Furthermore, film formation conditions of the aluminum oxide of the samples were set to Condition 1 and Condition 2.

FIG. 39A shows film density of the aluminum oxide under Condition 1 which was measured by an XRR method. Under Condition 1, fitting was performed on the assumption that a layer 1, a layer 2, and a layer 3 were stacked in this order. As a result, under Condition 1, a region with a film density of less than 3.2 g/cm$^3$ and a region with a film density of higher than or equal to 3.2 g/cm$^3$ were observed.

FIG. 39B shows film density of the aluminum oxide under Condition 2 which was measured by an XRR method. Under Condition 2, fitting was performed on the assumption that the layer 1, the layer 2, and the layer 3 were stacked in this order. On the sample whose percentage of an oxygen gas was 100%, fitting was performed on the assumption that a layer 4 was formed over the layer 3. As a result, under Condition 2, a region whose film density was less than 3.2 g/cm$^3$ was mostly occupied.

Thus, under Condition 2, the hydrogen-blocking property was high because the percentage of a region with low film density was high or the percentage of a region with high film density was low.

Figure 40:
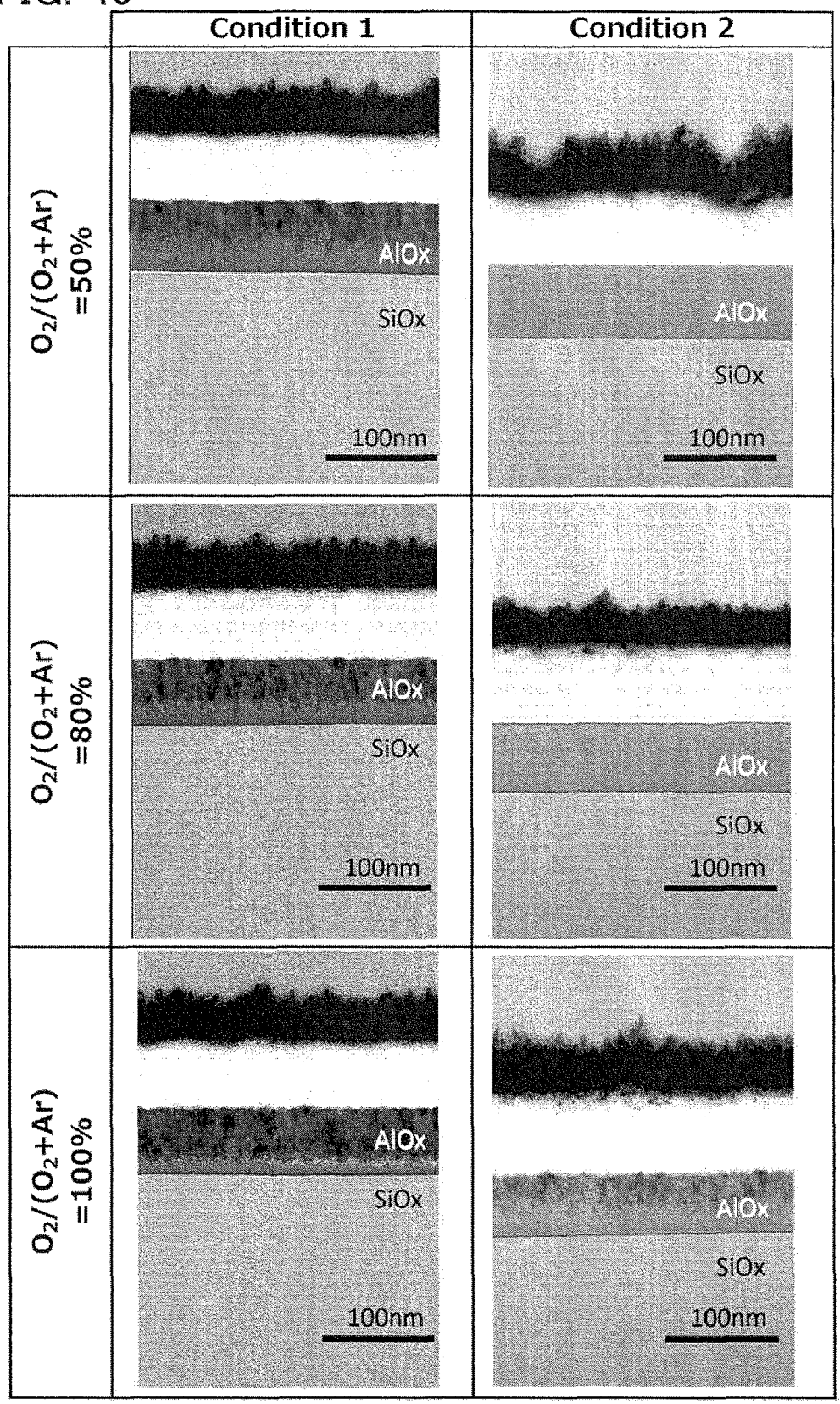
FIG. 40 shows cross-sectional STEM images.

Next, FIG. 40 shows cross sections of the samples observed by a scanning transmission electron microscope (STEM) (also referred to as cross-sectional STEM images).

It is found from FIG. 40 that the aluminum oxide under Condition 1 was generally divided into two layers as measured by an XRR method. Specifically, a region with low crystallinity was provided on the silicon oxide (also referred to as SiO$_x$) side, and a region with high crystallinity was provided thereover. On the other hand, the aluminum oxide under Condition 2 entirely had lower crystallinity and more uniform film quality than that under Condition 1 while crystallinity was slightly observed in the sample whose percentage of an oxygen gas was 100%.

The cross-sectional STEM images indicate that under Condition 2, a high blocking property was obtained owing to low crystallinity and a uniform film quality.

As described above, the aluminum oxide shown in this example had a function of blocking hydrogen. Furthermore, as the crystallinity was lower or the proportion of a region with a low film density was increased, the hydrogen blocking property became higher.

This application is based on Japanese Patent Application serial no. 2013-270926 filed with Japan Patent Office on Dec. 27, 2013, the entire contents of which are hereby incorporated by reference.

What is claimed is:

1. A semiconductor device comprising:
a first transistor comprising silicon;
a first aluminum oxide film over the first transistor;
a second transistor comprising an oxide semiconductor over the first aluminum oxide film; and
a second aluminum oxide film over the second transistor,
wherein the oxide semiconductor has a lower hydrogen concentration than the silicon, and
wherein the first aluminum oxide film includes a first region with a density of lower than 3.2 g/cm$^3$.

2. The semiconductor device according to claim 1, wherein the density of the first region included in the first aluminum oxide film is measured by an X-ray reflectivity method.

3. The semiconductor device according to claim 1,
wherein the first aluminum oxide film includes a second region with a density of higher than 3.2 g/cm$^3$, and
wherein a percentage of the first region is higher than a percentage of the second region in the first aluminum oxide film.

4. The semiconductor device according to claim 1,
wherein the second transistor comprises a conductor over and in contact with the first aluminum oxide film.

5. The semiconductor device according to claim 1, wherein a concentration of hydrogen in the oxide semiconductor is lower than or equal to 1×10$^{19}$ atoms/cm$^3$.

6. The semiconductor device according to claim 1, further comprising a silicon oxide film between the first aluminum oxide film and the second transistor,
wherein a number of oxygen atoms per unit volume is more than twice a number of silicon atoms per unit volume in the silicon oxide film.

7. The semiconductor device according to claim 1, wherein the first aluminum oxide film is capable of blocking oxygen and hydrogen.

8. A semiconductor device comprising:
a first transistor comprising silicon;
a first aluminum oxide film over the first transistor;
a second transistor over the first aluminum oxide film, the second transistor comprising:
a first conductor over the first aluminum oxide film;
a first insulator over the first conductor;
a first oxide semiconductor over the first insulator;
a second oxide semiconductor over the first oxide semiconductor;
a second conductor and a third conductor over the second oxide semiconductor;
a third oxide semiconductor over the second conductor and the third conductor;
a second insulator over the third conductor;

a fourth conductor over the third conductor, and
a second aluminum oxide film over the second transistor,
wherein each of the first oxide semiconductor, the second oxide semiconductor, and the third oxide semiconductor has a lower hydrogen concentration than the silicon, and
wherein the first aluminum oxide film includes a first region with a density of lower than 3.2 g/cm$^3$.

9. The semiconductor device according to claim 8, wherein the density of the first region included in the first aluminum oxide film is measured by an X-ray reflectivity method.

10. The semiconductor device according to claim 8, wherein the first aluminum oxide film includes a second region with a density of higher than 3.2 g/cm$^3$, and
wherein a percentage of the first region is higher than a percentage of the second region in the first aluminum oxide film.

11. The semiconductor device according to claim 8, wherein the first conductor is in contact with the first aluminum oxide film.

12. The semiconductor device according to claim 8, wherein a concentration of hydrogen in the second oxide semiconductor is lower than or equal to $1 \times 10^{19}$ atoms/cm$^3$.

13. The semiconductor device according to claim 8, further comprising a silicon oxide film between the first aluminum oxide film and the second transistor,
wherein a number of oxygen atoms per unit volume is more than twice a number of silicon atoms per unit volume in the silicon oxide film.

14. The semiconductor device according to claim 8, wherein the first aluminum oxide film is capable of blocking oxygen and hydrogen.

* * * * *